(12) United States Patent
Aldaz et al.

(10) Patent No.: US 10,043,946 B2
(45) Date of Patent: Aug. 7, 2018

(54) METHODS AND DEVICES FOR LIGHT EXTRACTION FROM A GROUP III-NITRIDE VOLUMETRIC LED USING SURFACE AND SIDEWALL ROUGHENING

(71) Applicant: SORAA, INC., Fremont, CA (US)

(72) Inventors: Rafael Aldaz, Fremont, CA (US); Aurelien J. F. David, San Francisco, CA (US); Daniel F. Feezell, Fremont, CA (US); Thomas M. Katona, Fremont, CA (US); Rajat Sharma, Fremont, CA (US); Michael J. Cich, Fremont, CA (US)

(73) Assignee: Soraa, Inc., Freemont, CA (US)

(*) Notice: Subject to any disclaimer, the term of this patent is extended or adjusted under 35 U.S.C. 154(b) by 0 days.

(21) Appl. No.: 15/226,656

(22) Filed: Aug. 2, 2016

(65) Prior Publication Data

US 2016/0343908 A1    Nov. 24, 2016

Related U.S. Application Data

(63) Continuation-in-part of application No. 14/632,755, filed on Feb. 26, 2015, now Pat. No. 9,406,843, which is a continuation of application No. 13/781,633, filed on Feb. 28, 2013, now Pat. No. 9,000,466, which is a continuation-in-part of application No. 12/861,765, filed on Aug. 23, 2010, now abandoned.

(60) Provisional application No. 61/236,838, filed on Aug. 25, 2009.

(51) Int. Cl.
*H01L 33/22* (2010.01)
*H01L 33/32* (2010.01)
*H01L 33/00* (2010.01)
*H01L 33/20* (2010.01)

(52) U.S. Cl.
CPC .......... *H01L 33/22* (2013.01); *H01L 33/0095* (2013.01); *H01L 33/32* (2013.01); *H01L 33/20* (2013.01)

(58) Field of Classification Search
CPC .......................... H01L 33/22; H01L 33/0095
See application file for complete search history.

(56) References Cited

U.S. PATENT DOCUMENTS

| | | | |
|---|---|---|---|
| 6,414,973 B1* | 7/2002 | Hwu | H01S 5/14 372/19 |
| 2009/0020781 A1* | 1/2009 | Lai | H01L 33/22 257/103 |
| 2012/0037930 A1* | 2/2012 | Hoppel | H01L 33/0079 257/88 |

* cited by examiner

Primary Examiner — Marc Armand
(74) Attorney, Agent, or Firm — FisherBroyles LLP

(57) ABSTRACT

A method of fabricating LEDs from a wafer comprising a substrate and epitaxial layers and having a substrate side and a epitaxial side, said method comprising: (a) applying a laser beam across at least one of said substrate side or said epitaxial side of said wafer to define at least one laser-scribed recess having a laser-machined surface; and (b) singulating said wafer along said laser-scribed recess to form singulated LEDs, said singulated LEDs having a top surface, a bottom surface, and a plurality of sidewalls, at least one of said sidewalls comprising at least a first portion comprising at least a portion of said laser-machined surface.

19 Claims, 39 Drawing Sheets

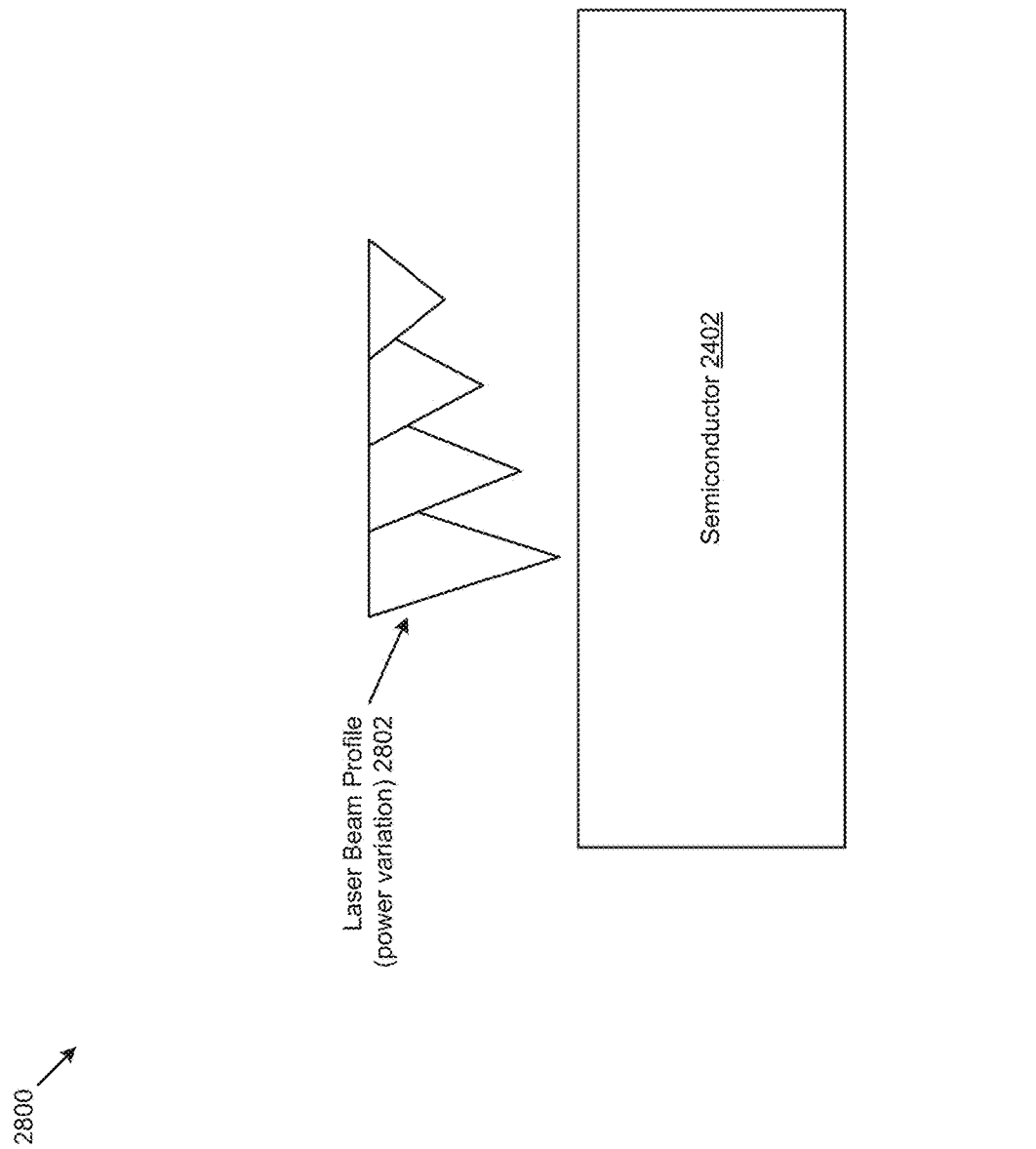

METHODS AND DEVICES FOR LIGHT EXTRACTION FROM A GROUP III-NITRIDE VOLUMETRIC LED USING SURFACE AND SIDEWALL ROUGHENING

RELATED APPLICATIONS

This application is a continuation-in-part of U.S. application Ser. No. 14/632,755 filed on Feb. 26, 2015, which is a continuation of U.S. application Ser. No. 13/781,633 filed Feb. 28, 2013, which is a continuation in part of U.S. application Ser. No. 12/861,765 filed Aug. 23, 2010, which claims the benefit under 35 U.S.C. § 119(e) of U.S. Provisional Patent Application No. 61/236,838 filed on Aug. 25, 2009, each of which is incorporated by reference in its entirety.

FIELD OF DISCLOSURE

The disclosure relates to the field of LED light chips, and more particularly to techniques for achieving high-performance light extraction from an LED chip.

BACKGROUND

The present disclosure is directed to an improved approach for achieving high-performance light extraction from a Group III-nitride volumetric LED chips. More particularly, disclosed herein are techniques for achieving high-performance light extraction from a Group III-nitride volumetric LED chip using undulated slanted sidewalls and surface roughening.

In making LED chips, improving the performance of light extraction from the material is an important design consideration. In some situations patterning or roughening of certain surfaces can improve light extraction. And, in some situations the materials used in making LEDs (e.g., GaN, Sapphire, SiC) are laser-scribed, laser-shaped and otherwise manipulated during process such that those processes result in shaping and roughening of the surfaces of the LED device and/or surrounding structures. New shaping and roughening techniques are called for in order to achieve high-performance light extraction when using Group III-nitride materials.

SUMMARY

Embodiments of the present disclosures are directed to improved approaches for achieving high-performance light extraction. More particularly, disclosed herein are techniques for achieving high-performance light extraction from a Group III-nitride volumetric LED chip using undulated slanted sidewalls and surface roughening.

The present disclosure provides improved techniques to address the aforementioned issues with legacy approaches. More specifically, the present disclosure provides a detailed description of die shaping and die sidewall roughening techniques used to achieve high-performance light extraction from Group III-nitride volumetric LED chips.

The methods refer generally to GaN-based light emitting diodes grown on sapphire, SiC or similar heteroepitaxial substrate. In a specific embodiment, the present techniques provide a device configuration with a high extraction geometry, and fabrication method thereof, for a GaN-based light emitting diode overlying a bulk-GaN containing substrate.

Volumetric chips (e.g., chips where the vertical-to-horizontal aspect ratio of the chip is greater than 5%, and can be on the order of 100% or larger) are advantageous, because they benefit from additional extraction from the sidewalls (e.g., lateral surfaces) of the chip. This helps to extract glancing-angle light. In order to further increase light extraction, one can modify the sidewall facets in order to break these quasi-guided trajectories. This can be done by shaping and texturing of the sidewall facets.

Further details of aspects, objects, and advantages of the disclosure are described below in the detailed description, drawings, and claims. Both the foregoing general description of the background and the following detailed description are exemplary and explanatory, and are not intended to be limiting as to the scope of the claims.

BRIEF DESCRIPTION OF THE DRAWINGS

The drawings described below are for illustration purposes only. The drawings are not intended to limit the scope of the present disclosure. This patent or application file contains at least one drawing executed in color. Copies of this patent or patent application publication with color drawings will be provided by the U.S. Patent and Trademark Office upon request and payment of the necessary fee.

FIG. 28 shows process for using a staggered laser beam profile depicting variation of pulse width and power, according to some embodiments.

DETAILED DESCRIPTION

Figure 1:
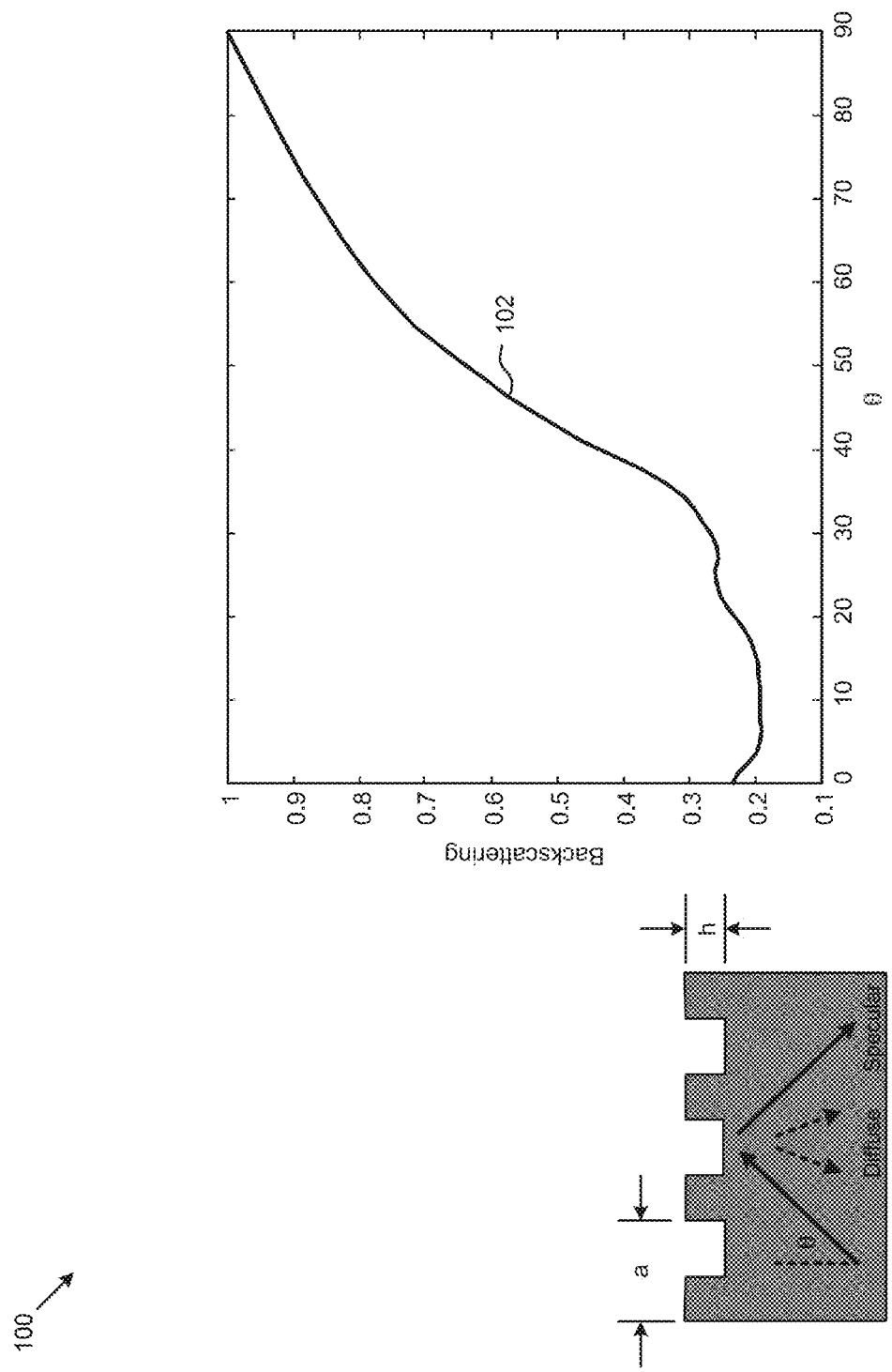
FIG. 1 is a chart characterizing backscattering behavior as a function of polar angle of incidence for achieving high-performance light extraction from a Group III-nitride volumetric LED chip using surface and sidewall roughening, according to some embodiments.

Various embodiments will now be described more fully hereinafter with reference to the accompanying drawings, in which exemplary embodiments are shown. Various aspects may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

Embodiments of the present disclosures are directed to improved approaches for achieving high-performance light extraction from LED chips. More particularly, disclosed herein are techniques for achieving high-performance light extraction from a Group III-nitride volumetric LED chip by using laser ablation techniques to achieve sidewall slanting and surface roughening.

In making LED chips, improving the performance of light extraction from the material is an important design consideration. In some situations the shape of the device (e.g., as pertains to light extraction) and the patterning or roughening of certain surfaces can improve light extraction. And, in some situations the materials used in making LEDs (e.g., GaN, Sapphire, SiC) are scribed, sawed, cleaved and otherwise manipulated during process such that those processes result in patterning or roughening of the surfaces of the LED device and/or surrounding structures. However, when Group III-nitride materials (e.g., gallium nitride) is used, traditional cleaving or other manipulations do not necessarily result in patterning or roughening of the surfaces of the LED device and/or surrounding structures, and other techniques are called for in order to achieve high-performance light extraction.

Moreover, the manufacture of Group III-nitride volumetric LED chips might involve cleaving along certain selected planes (e.g., c-plane, m-plane), and certain processing techniques (e.g., laser scribing) might be used with the Group III-nitride material, thus further demanding advances in the techniques to produce Group III-nitride volumetric LED chips that exhibit high-performance light extraction from surface and sidewall roughening.

Therefore, there is a need for an improved approach for achieving high-performance light extraction from Group III-nitride volumetric LED chips. In the approach to achieve high-performance light extraction from surface and sidewall roughening when using Group III-nitride materials, many discoveries have been made, which discoveries and embodiments thereto are disclosed in detail below.

Reference is now made in detail to certain embodiments. The disclosed embodiments are not intended to be limiting of the claims. Various embodiments will now be described more fully hereinafter with reference to the accompanying drawings, in which exemplary embodiments are shown. Various aspects may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

Embodiments of the present disclosure provide improved techniques to address the aforementioned issues with legacy approaches. More specifically, the present disclosure provides a detailed description of surface and sidewall roughening techniques used to achieve high-performance light extraction from Group III-nitride volumetric LED chips.

The methods refer generally to GaN-based light emitting diodes grown on sapphire, SiC or similar heteroepitaxial substrate. In an embodiment, the present techniques provide a device configuration with a high extraction geometry, and fabrication method thereof, for a GaN-based light emitting diode overlying a bulk-GaN containing substrate.

Volumetric chips (e.g., chips where the vertical-to-horizontal aspect ratio of the chip is greater than 5%, and can be on the order of 100% or larger) are advantageous, because they benefit from additional extraction from the sidewalls (e.g., lateral surfaces) of the chip. This helps to extract glancing-angle light. In order to further increase light extraction, one can modify the sidewall facets in order to break these quasi-guided trajectories. This can be done by texturing of the sidewall facets. One way to texture the sidewalls is to produce 1-dimensional roughness, such as vertical striations.

Further, improvements in extraction efficiency can be achieved by implementing 1-dimensional and 2-dimensional sidewall roughening. In some embodiments, the extraction efficiency for a chip with top roughness is 70%. With combinations of 1D and 2D sidewall roughness, light extraction is boosted to ~82%.

As used herein, the term GaN substrate is associated with Group III-nitride based materials including GaN, InGaN, AlGaN, or other Group III containing alloys or compositions that are used as starting materials. Such starting materials include polar GaN substrates (i.e., substrate where the largest area surface is nominally an (h k l) plane where h=k=0, and l is non-zero), non-polar GaN substrates (i.e., substrate material where the largest area surface is oriented at an angle ranging from about 80 degrees to 100 degrees from the polar orientation described above towards an (h k l) plane where l=0, and at least one of h and k is non-zero) or semi-polar GaN substrates (i.e., substrate material where the largest area surface is oriented at an angle ranging from about +0.1 degrees to 80 degrees or 110 degrees 179.9 degrees from the polar orientation described above towards an (h k l) plane where l=0, and at least one of h and k is non-zero). Of course, there can be other variations, modifications, and alternatives.

The high-refractive index of Group III-nitride based semiconductor devices results in a large fraction of emitted light being totally-internally reflected at the semiconductor/air or semiconductor/encapsulant interface on the first pass. The embodiments contained herein provides methods for enhancing the fraction of emitted light from a light emitting diode device which escapes the semiconductor/air or semiconductor/encapsulant interface on the first pass, and thereby improving the overall external quantum efficiency of the light emitting diode device. This is achieved through texturing or roughening of the sidewalls or side-surfaces of a light emitting diode device chip by applying the methods described in the embodiments below, so as to enhance the extraction of light from these sidewalls or side-surfaces.

For high-power chips, a wafer-bonded geometry is often used for thermal management. In this case the p-side of the chip is covered by a reflective contact and light is mostly extracted though the top side. To increase light extraction, this top surface is typically roughened in order to randomize light trajectories and avoid guiding of light. Scattering properties of a surface (e.g., surface roughness) improves light extraction in an LED. The following discussions assume roughening features with an average lateral distance on the order of ~1 µm, as is typically obtained by processes such as chemical etching or photo-electro-chemical etching and present in commercial Group III-nitride LEDs. The parameter which drives the scattering strength in the calculations shown below is the so-called filling fraction f, e.g., the area coverage of the scattering features. A small filling fraction corresponds to scattering features with narrow lateral dimensions separated by flat regions, while f>0.5 is representative of GaN roughness in some commercial LEDs. The scattering properties of such a surface are illustrated on FIG. 1, which represents the one-bounce backscattering Sb (e.g., the amount of light which is sent back in the semiconductor) for a typical embodiment of a rough surface. A low backscattering corresponds to a large forward-scattering, and hence a large light extraction.

An important parameter in describing a rough surface is the characteristic size of the features forming the roughness. In typical embodiments, this characteristic size is related to the wavelength of light $\lambda$ and the index of the LED material n. For instance, in some embodiments, the characteristic size is larger than 0.1 time $\lambda$/n and smaller than 30 times $\lambda$/n. The roughness of the surface can further be described in terms of the shape of features that form the roughened surface. For instance, the roughness can be one-dimensional (e.g., linear striations) or two-dimensional (e.g., surface variations in both in-plane directions). Further, two-dimensional roughness can be composed of a variety of shapes such as pyramidal features, truncated pyramidal features, cylindrical features, square features, spherical features, elliptical features, or a combination of these shapes.

FIG. 1 is a chart characterizing backscattering behavior as a function of polar angle of incidence for achieving high-performance light extraction from a Group III-nitride volumetric LED chip using surface and sidewall roughening. As an option, the present model characterizing backscattering behavior as a function of polar angle of incidence may be implemented in the context of the architecture and functionality of the embodiments described herein. Also, the method for characterizing backscattering behavior as a function of polar angle of incidence or any characteristic therein may be carried out in any desired environment. FIG. 1 shows that Sb becomes close to unity for angles larger than 70°. This indicates that extraction to the outside of the chip is not efficient, and that light will need many bounces to be extracted. FIG. 1 illustrates backscattering of a typical patterned surface versus polar angle of incidence $\theta$ averaged over the azimuthal angle $\phi$ (see plot 102). Here the surface is a GaN/epoxy interface made of cylindrical rods (filling fraction f=0.3), height h averaged from 0.8 to 1.2, pitch averaged from 0.8 to 1.2). All distances in units of the free wavelength $\lambda$.

Figure 2:
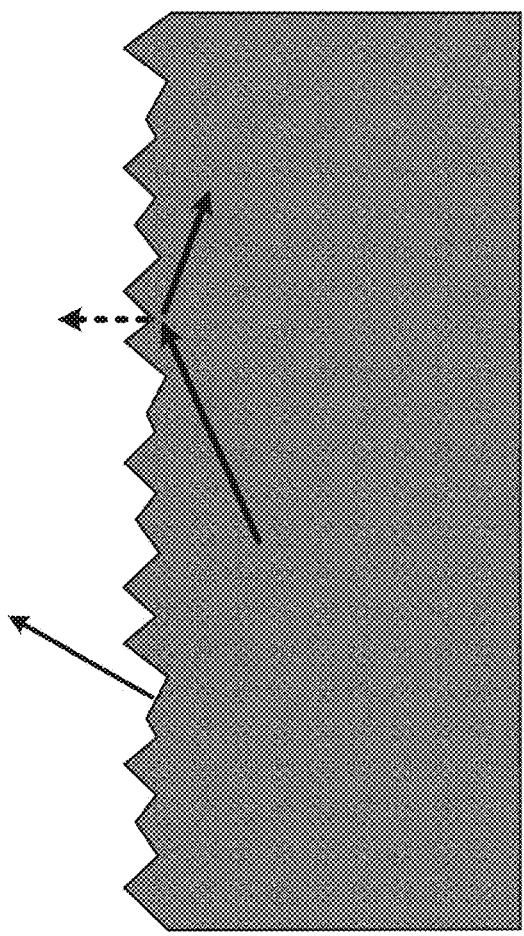
FIG. 2 is a simplified diagram of a model exhibiting backscattering behavior for achieving high-performance light extraction from a Group III-nitride volumetric LED chip using surface and sidewall roughening, according to some embodiments.

Contrary to intuition, typical 'random' surfaces in LEDs do not necessarily fully randomize light trajectory—most notably, light propagating near glancing angles is poorly extracted/diffused, and mostly undergoes specular reflection. FIG. 2 schematically represents this behavior.

FIG. 2 is a diagram of model exhibiting backscattering behavior for achieving high-performance light extraction from a Group III-nitride volumetric LED chip using surface and sidewall roughening. As an option, the present model exhibiting backscattering behavior may be implemented in the context of the architecture and functionality of the embodiments described herein. As shown, the details of the roughness do not affect these results for features of a given size. FIG. 2 shows the schematic behavior of a typical roughened surface. Light propagating close to normal incidence (thin lines) is efficiently extracted. However, for light propagating near glancing angle (thick lines), only a small fraction of the light is extracted (thick line) while a large fraction is backscattered.

Figure 3:
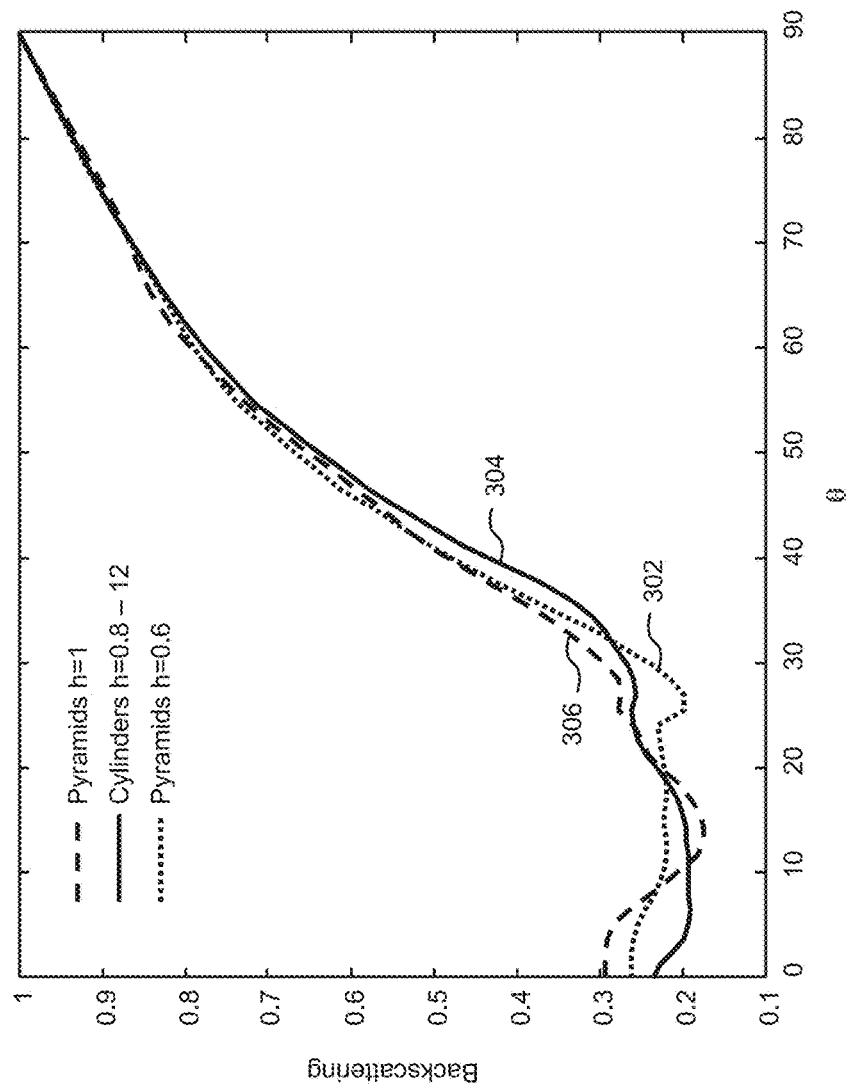
FIG. 3 is a chart characterizing backscattering behavior as a function of polar angle of incidence with various roughening patterns for achieving high-performance light extraction from a Group III-nitride volumetric LED chip using surface and sidewall roughening, according to some embodiments.

FIG. 3 is a chart characterizing backscattering behavior as a function of polar angle of incidence with various roughening patterns for achieving high-performance light extraction from a Group III-nitride volumetric LED chip using surface and sidewall roughening. As an option, the present model characterizing backscattering behavior as a function of polar angle of incidence with various roughening patterns may be implemented in the context of the architecture and functionality of the embodiments described herein.

FIG. 3 illustrates structural features by comparing the scattering behavior of periodic structures having cylindrical and pyramidal features. In this calculation, the rough features have similar sizes, and show similar scattering behavior. This result can be extended to disordered structures by use of a supercell model which considers a periodic structure with a large period whose unit cell is composed of several scattering elements of varying shape and size, and thus approximates the description of a disordered rough surface. Again, use such of a supercell model shows a very similar scattering behavior to that shown in FIG. 3. These scattering properties can be integrated to a ray-tracing light extraction model in order to describe realistic LED chips and understand how the scattering properties impact light extraction. Below are described various applications of such a model to selected geometries of interest. FIG. 3 shows backscattering of various rough surfaces versus polar angle of incidence q: (solid line 304): cylindrical rods (height averaged from 0.8 to 1.2). Dashed line 306: pyramids (height 1). Dotted line 302: pyramids (height 0.6). All distances in units of the free wavelength l. All structures have a filling fraction f=0.3.

Thin-Film Chips

Figure 4:
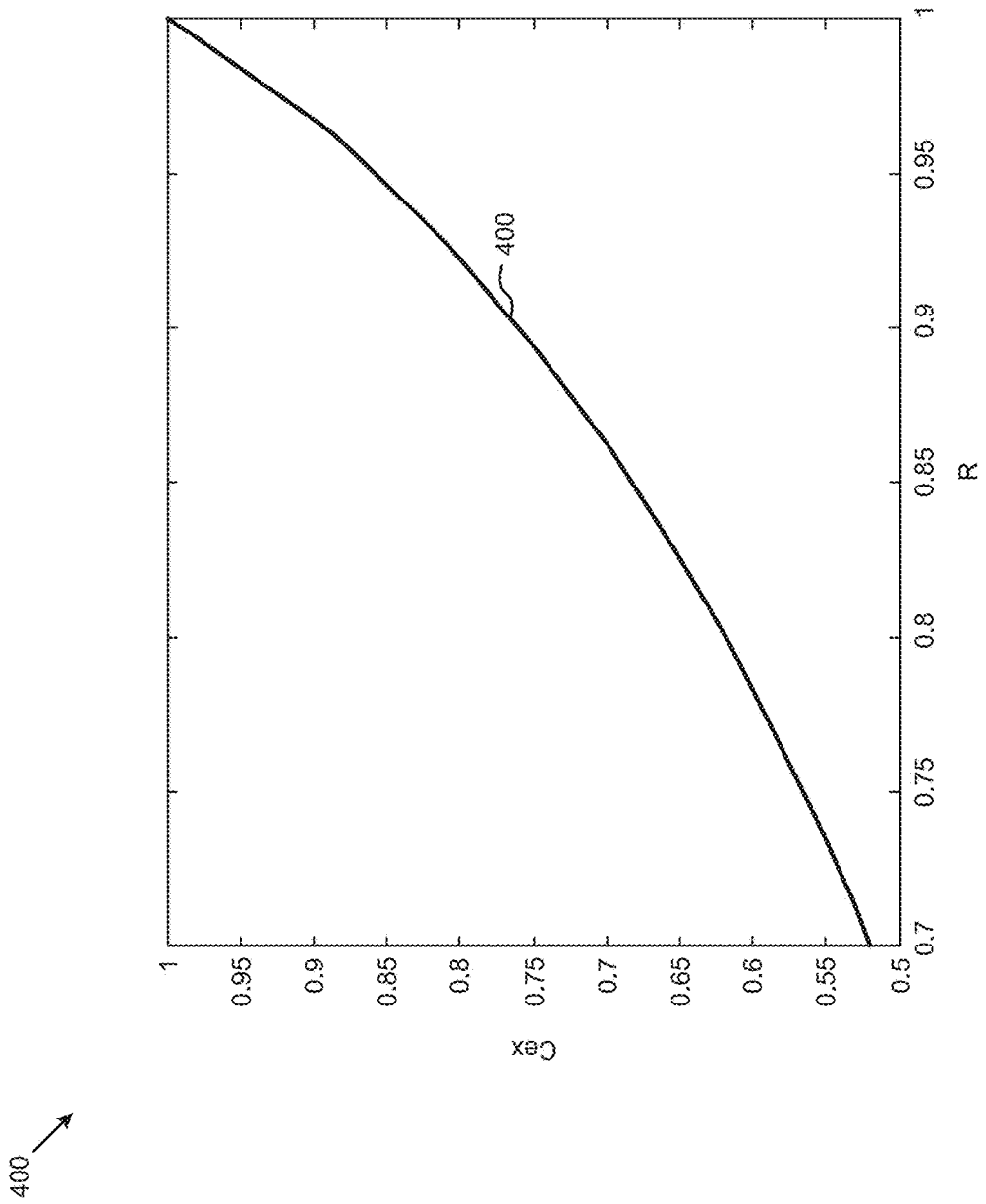
FIG. 4 is a chart characterizing light extraction as a function of top surface roughness for achieving high-performance light extraction from a Group III-nitride volumetric LED chip using surface roughening, according to some embodiments.

Thin-film chips (where the ratio of vertical-to-horizontal dimensions is less than 5%, and often less than 1%) are strongly affected by the scattering behavior of the scattering surface. This is illustrated in FIG. 4 which shows the extraction efficiency Cex of a 1 mm×1 mm×5 µm chip (typical dimensions for commercial power chips) with top surface roughness, as a function of the reflectivity R of the p-mirror. In this simple model, the p-mirror is the only source of loss. A large value of R is necessary to obtain high Cex>80% due to the difficulty to extract glancing-angle light. Additional models (e.g., that model additional characteristics beyond the model of FIG. 4) show similar results.

FIG. 4 is a chart characterizing light extraction as a function of top surface roughness for achieving high-performance light extraction from a Group III-nitride volumetric LED chip using surface and sidewall roughening. As an option, the present model characterizing light extraction as a function of top surface roughness may be implemented in the context of the architecture and functionality of the embodiments described herein. FIG. 4 shows a square thin-film chip (1 mm×1 mm×5 µm) with a top surface roughness and varying p-mirror reflectively (see line 402).

In this simple model, the p-mirror is the only source of loss. A large value of R is necessary to obtain high Cex>80% due to the difficulty to extract glancing-angle light. This is illustrated in FIG. 5.

Figure 5:
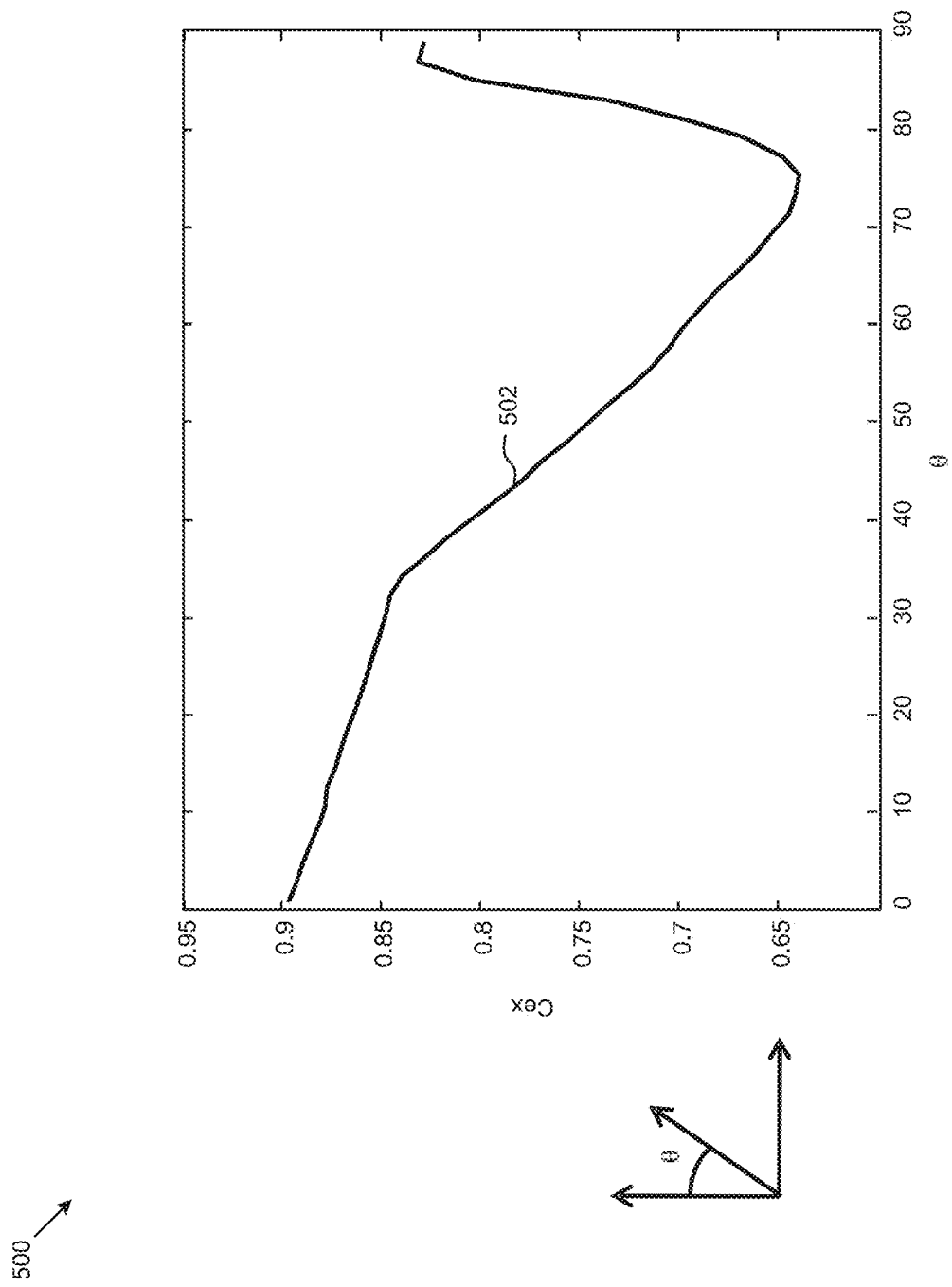
FIG. 5 is a chart characterizing light extraction as a function of polar emission angle for achieving high-performance light extraction from a Group III-nitride volumetric LED chip using surface roughening, according to some embodiments.

FIG. 5 is a chart characterizing light extraction as a function of polar emission angle (see line 502) for achieving high-performance light extraction from a Group III-nitride volumetric LED chip using surface and sidewall roughening. As an option, the present model characterizing light extraction as a function of polar emission angle may be implemented in the context of the architecture and functionality of the embodiments described herein.

Figure 6:
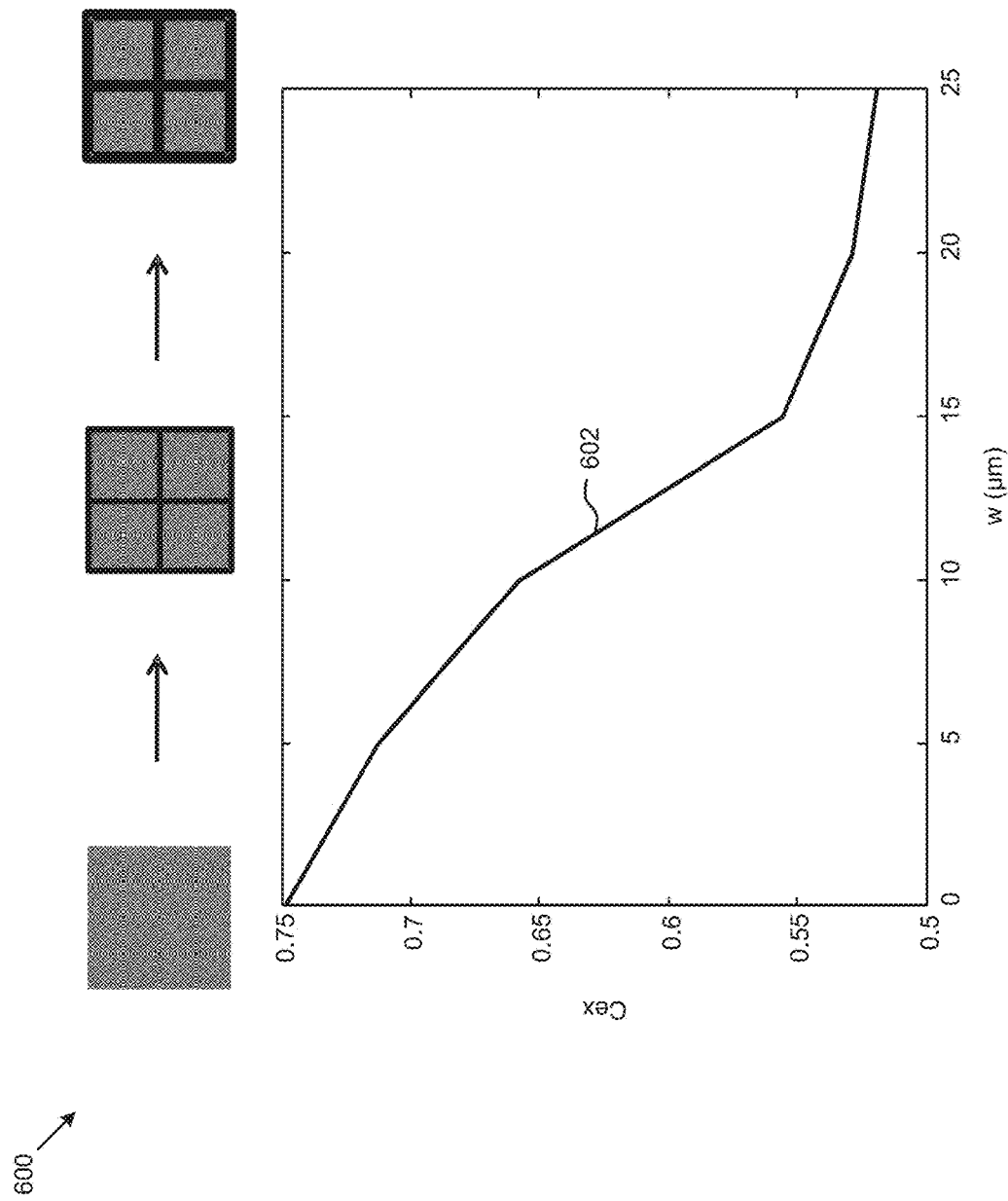
FIG. 6 is a chart characterizing light extraction as a function of n-grid width for achieving high-performance light extraction from a Group III-nitride volumetric LED chip using surface roughening, according to some embodiments.

As shown, FIG. 5 details the extraction efficiency Cex($\theta$) versus the polar angle of emission $\theta$ (averaged over the azimuthal angle $\phi$, and for a p-mirror reflectivity R=90%), and shows a collapse of Cex at large $\theta$. This situation is exacerbated when considering additional absorbing features (such as n-electrodes) that are present in chips. FIG. 6 illustrates this situation. FIG. 5 shows a square chip (1 mm×1 mm×5 µm) with a top surface roughness and R=90% p-mirror reflectively and details of extraction efficiency as a function of polar emission angle θ (averaged over the azimuthal angle of emission ϕ). Angle around 50° to 85° are poorly extracted.

FIG. 6 is a chart characterizing light extraction as a function of n-grid width (see line 602) for achieving high-performance light extraction from a Group III-nitride volumetric LED chip using surface and sidewall roughening. As an option, the present model characterizing light extraction as a function of n-grid width may be implemented in the context of the architecture and functionality of the embodiments described herein. Also, the method for characterizing light extraction as a function of n-grid width or any characteristic therein may be carried out in any desired environment. FIG. 6 shows a square chip (1 mm×1 mm) with a top surface roughness and R=90% p-mirror reflectively, varying n-grid width.

The chip of FIG. 6 depicts a chip of similar dimensions but with a square n-grid of pitch a=250 µm, and of low reflectivity (R=50%) and varying grid width w. As w increases, Cex is strongly impacted—this is because glancing-angle light travels large lateral distances and has a high probability of reaching the lossy n-grid. Again, this is seen in detail in FIG. 7.

Figure 7:
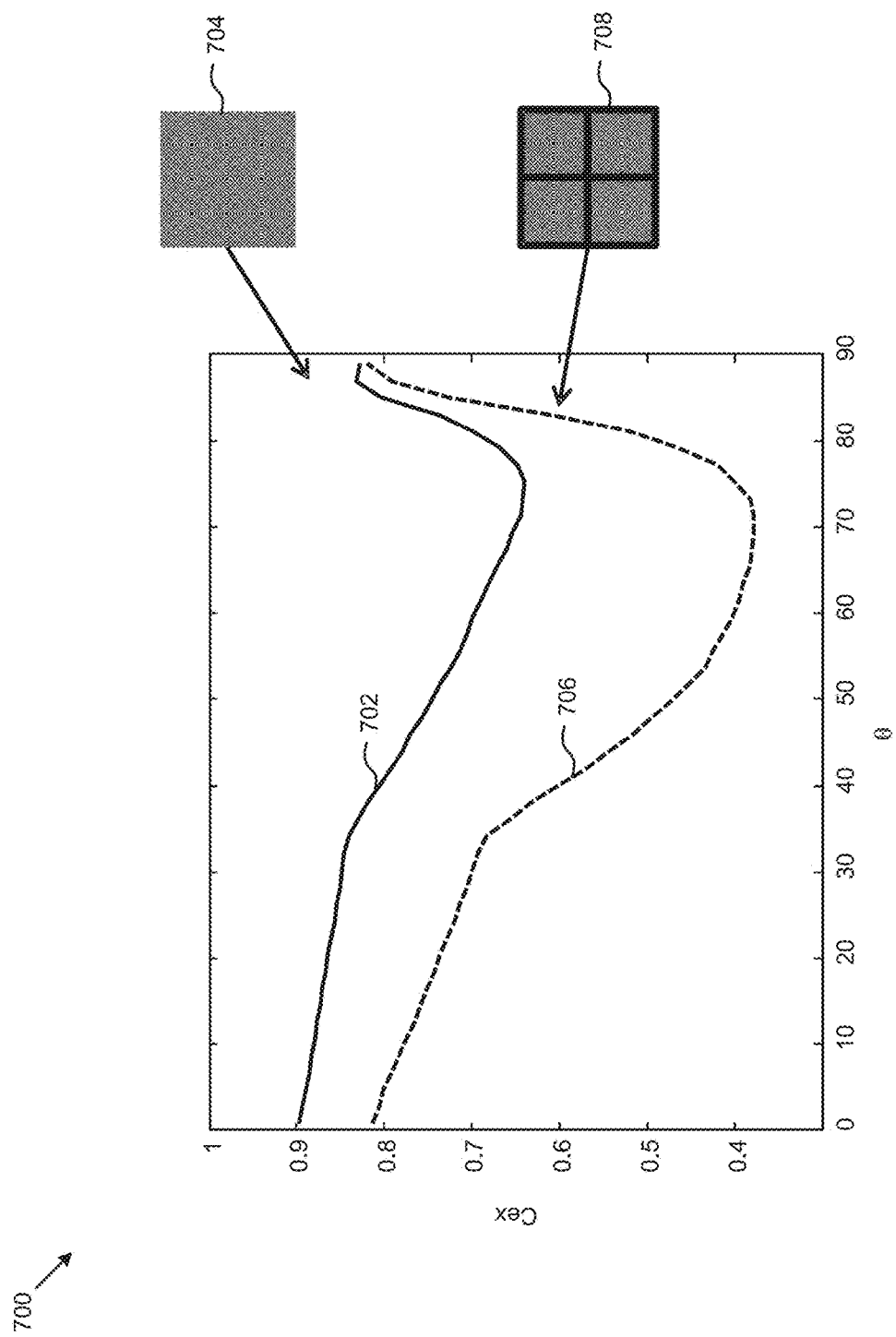
FIG. 7 is a chart characterizing light extraction as a function of polar emission angle, and showing n-grid width examples for achieving high-performance light extraction from a Group III-nitride volumetric LED chip using surface roughening, according to some embodiments.

FIG. 7 is a chart characterizing light extraction as a function of polar emission angle (see line 702) and line 706), and showing n-grid width examples for achieving high-performance light extraction from a Group III-nitride volumetric LED chip using surface and sidewall roughening. As an option, the present model characterizing light extraction as a function of polar emission angle, and showing n-grid width examples may be implemented in the context of the architecture and functionality of the embodiments described herein. Also, the techniques for characterizing light extraction as a function of polar emission angle, and showing n-grid width examples or any characteristic therein may be carried out in any desired environment. FIG. 7 shows a square chip (1 mm×1 mm) with top surface roughness and R=9-% p-mirror reflective and details of extraction efficiency as a function of polar emission angle θ. Full lines (see line 702) refer to non-grid 704 and dashed lines (see line 706) refer to 15 µm-wide n-grid 708.

FIG. 7 shows the same angle-dependent light extraction Cex(θ) as is shown in FIG. 5 (for w=15 µm), and where the suppression of Cex at large θ is even more pronounced.

Surface-Roughened Volumetric Chips

Volumetric chips (e.g., chips where the vertical-to-horizontal aspect ratio of the chip is greater than 5%, and can be on the order of 100% or larger) are advantageous, because they benefit from additional extraction from the sidewalls (e.g., lateral surfaces) of the chip. This helps to extract glancing-angle light.

Figure 8:
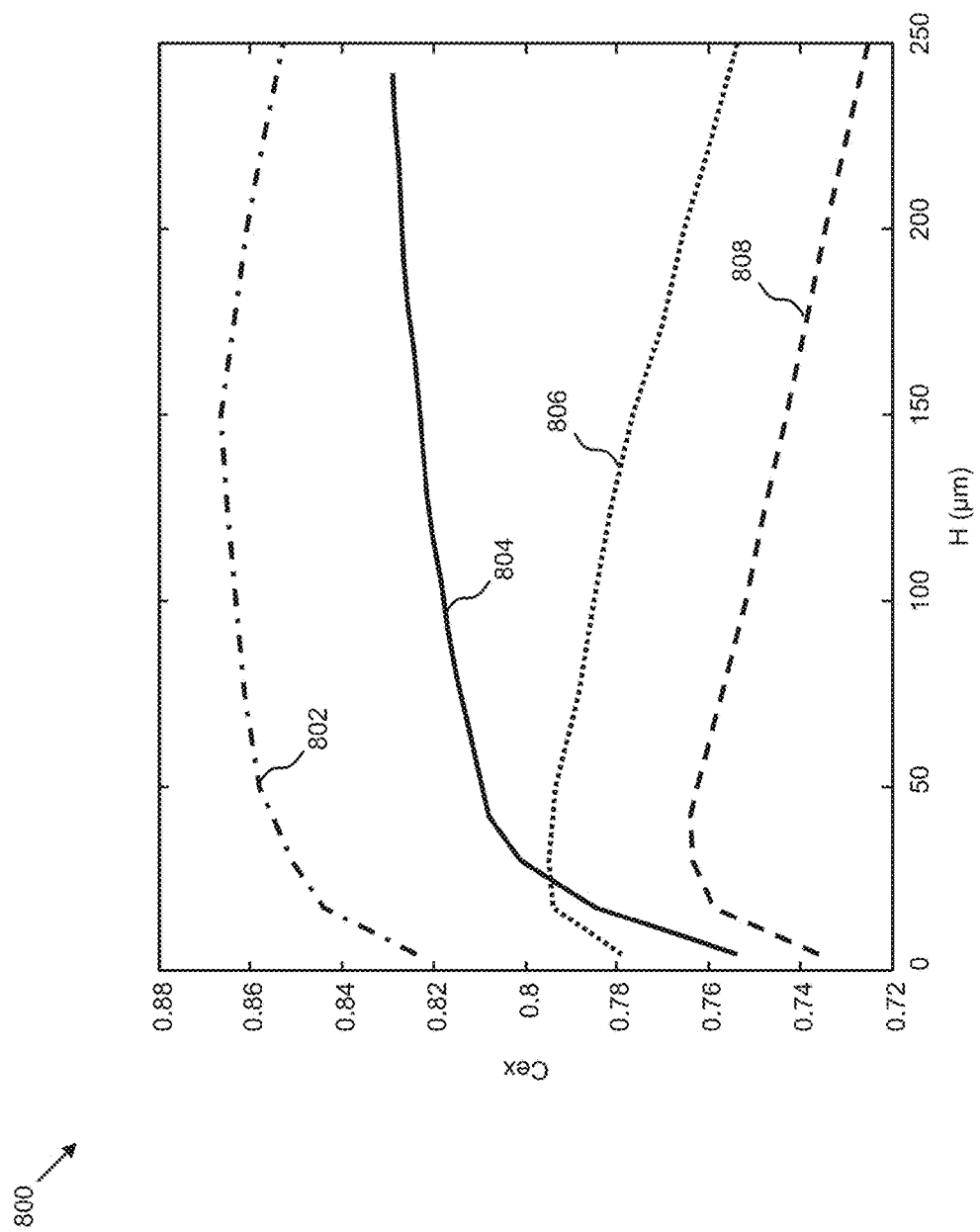
FIG. 8 is a chart characterizing light extraction as a function of chip height and showing examples varying lateral dimensions for achieving high-performance light extraction from a Group III-nitride volumetric LED chip using surface roughening, according to some embodiments.

FIG. 8 is a chart characterizing light extraction as a function of chip height and showing examples of varying lateral dimensions for achieving high-performance light extraction from a Group III-nitride volumetric LED chip using surface and sidewall roughening. As an option, the present model characterizing light extraction as a function of chip height and showing examples varying lateral dimensions may be implemented in the context of the architecture and functionality of the embodiments described herein.

FIG. 8 shows how increasing the thickness of a chip increases its extraction efficiency. First we consider a 1×1 mm surface-roughened chip, with p-mirror reflectivity R=90%. Increasing the thickness from 5 µm to 250 µm boosts the extraction from ~75% to ~83%, because large-angle light can now be extracted by the sidewalls (e.g., lateral surfaces). However, substrate loss can be present and hinder the beneficial effect of volumetric chips. If we assume a GaN absorption coefficient α=1 cm$^{-1}$, extraction is significantly impacted. This can be improved upon by reducing the lateral dimensions of the chip: with the same a, a 250×250 µm chip is about 4% more efficient than a 1 mm×1 mm chip. The beneficial impact of sidewalls for light extraction can further be improved by modifying the shape of the chip. For instance, using a chip with a triangular base and the same surface area enables more light trajectories to be extracted. From FIG. 8, the advantage of volumetric chips can be leveraged when the chip dimensions and shape are well chosen, considering the losses in the chip. FIG. 8 shows extraction efficiency vs. chip height, for chips with top surface roughness and R=90% p-mirror reflectivity: (solid line 804) 1 mm×1 mm square chip, no absorption in the GaN substrate; (dashed line 808) 1 mm×1 mm square chip, GaN absorption coefficient α=1 cm$^{-1}$; (dotted line 806) 250 µm×250 µm square chip, GaN absorption coefficient α=1 cm$^{-1}$; (dash-dotted line 802) Triangular chip (lateral dimension 380 µm), GaN absorption coefficient α=1 cm$^{-1}$.

We note that while we have modeled particular chip designs in the above, and other models of chips, additional sources of loss can be considered, for example: substrate absorption, absorption of all the contacts (p- and n-electrodes and additional interlayers), active region absorption, etc. In some of the following descriptions, realistic values for such losses are modeled.

More insight can be gained into the light-extraction process of such volumetric chips by looking at the angle-resolved extraction diagram Cex(θ,ϕ)—here it is relevant to consider both angles. For simplicity, let us first consider a smooth (non-roughened) chip.

Figure 9:
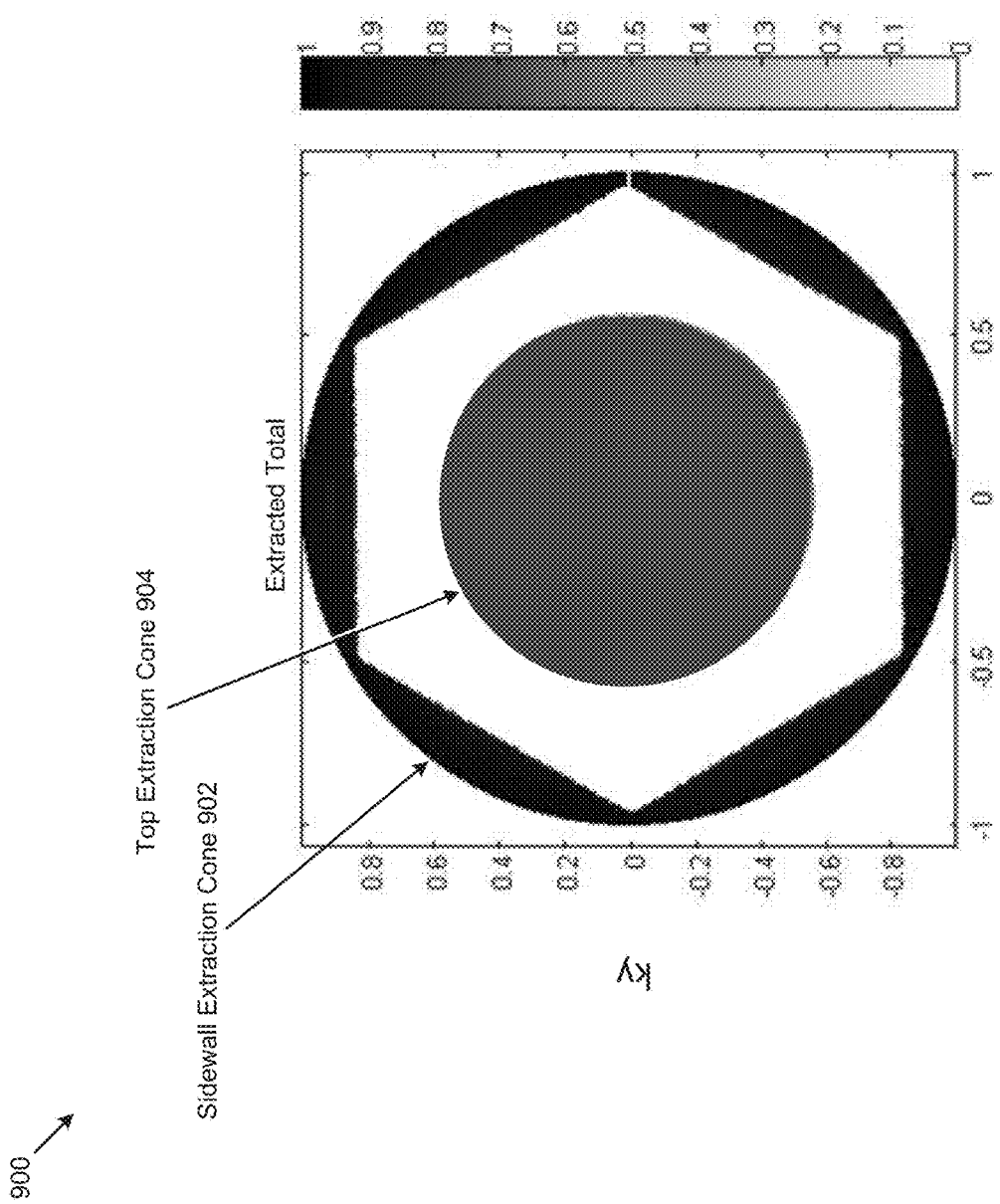
FIG. 9 is a chart characterizing extraction as a function of varied polar and azimuthal angles for a smooth volumetric chip for achieving high-performance light extraction from a Group III-nitride volumetric LED chip, according to some embodiments.

FIG. 9 is a chart showing extraction as a function of varied polar and azimuthal angles for a smooth volumetric chip for achieving high-performance light extraction from a Group III-nitride volumetric LED chip using surface and sidewall roughening. As an option, the present model extraction as a function of varied polar and azimuthal angles for a smooth volumetric chip may be implemented in the context of the architecture and functionality of the embodiments described herein.

FIG. 9 models a smooth GaN volumetric chip (triangular base 380 µm, height 200 µm) emitting into a silicone of index n=1.4. Extraction is only possible into seven extraction cones (one for the top surface, and six for the three sidewalls—either directly or after one in-plane bounce), while all the rest of the light is guided and eventually lost. To improve the extraction of light, in volumetric chips, its top surface can be roughened, which roughening serves to break guided light trajectories. A similar surface roughening approach can also improve light extraction in thin-film chips. FIG. 9 shows details of extraction vs. polar (q) and azimuthal (f) angles, for a smooth volumetric chip with a triangular base (lateral dimension 380 µm, height 200 µm). The direction of emitted light is characterized by the in-plane reduced wave vectors kx and ky. High extraction is obtained into the top extraction cone 904 and the six sidewall extraction cones (e.g., see sidewall extraction cone 902). No extraction is possible outside of these cones.

Figure 10:
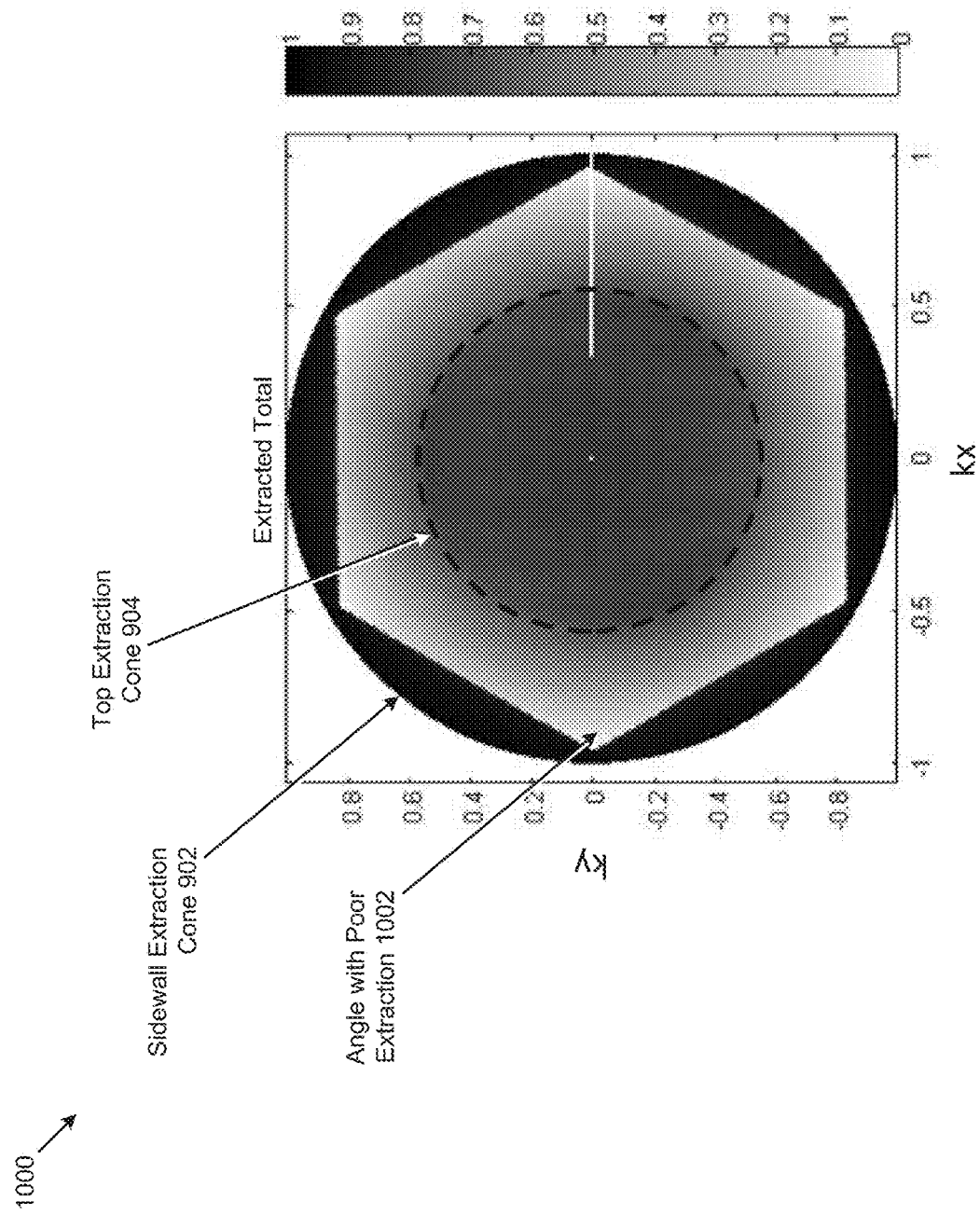
FIG. 10 is a chart showing light extraction as a function of varied polar and azimuthal angles for a surface-roughened volumetric chip for achieving high-performance light extraction from a Group III-nitride volumetric LED chip using surface roughening, according to some embodiments.

FIG. 10 is a chart showing light extraction as a function of varied polar and azimuthal angles for a surface-roughened volumetric chip for achieving high-performance light extraction from a Group III-nitride volumetric LED chip using surface and sidewall roughening. As an option, the present model light extraction as a function of varied polar and azimuthal angles for a surface-roughened volumetric chip may be implemented in the context of the architecture and functionality of the embodiments described herein.

As shown, FIG. 10 illustrates the modification of the angle-resolved extraction diagram when top surface roughness is implemented: Extraction is allowed for angles outside of the extraction cones (e.g., see sidewall extraction cone 902). However, this is not perfectly efficient because light propagating at large angles is weakly randomized, as was the case for a thin-film chip. Large angles still display limited extraction (e.g., poor extraction 1002). Such trajectories, which we refer to as "quasi-guided", limit the extraction efficiency of a GaN volumetric chip with top surface roughness. FIG. 10 shows details of extraction vs. polar (q) and azimuthal (f) angles, for a volumetric chip with a triangular base (lateral dimension 380 μm, height 200 μm) with top surface roughness. Surface roughness enables extraction of some of the light outside of the extraction cones—however this effect is limited, especially at large angles.

Figure 11:
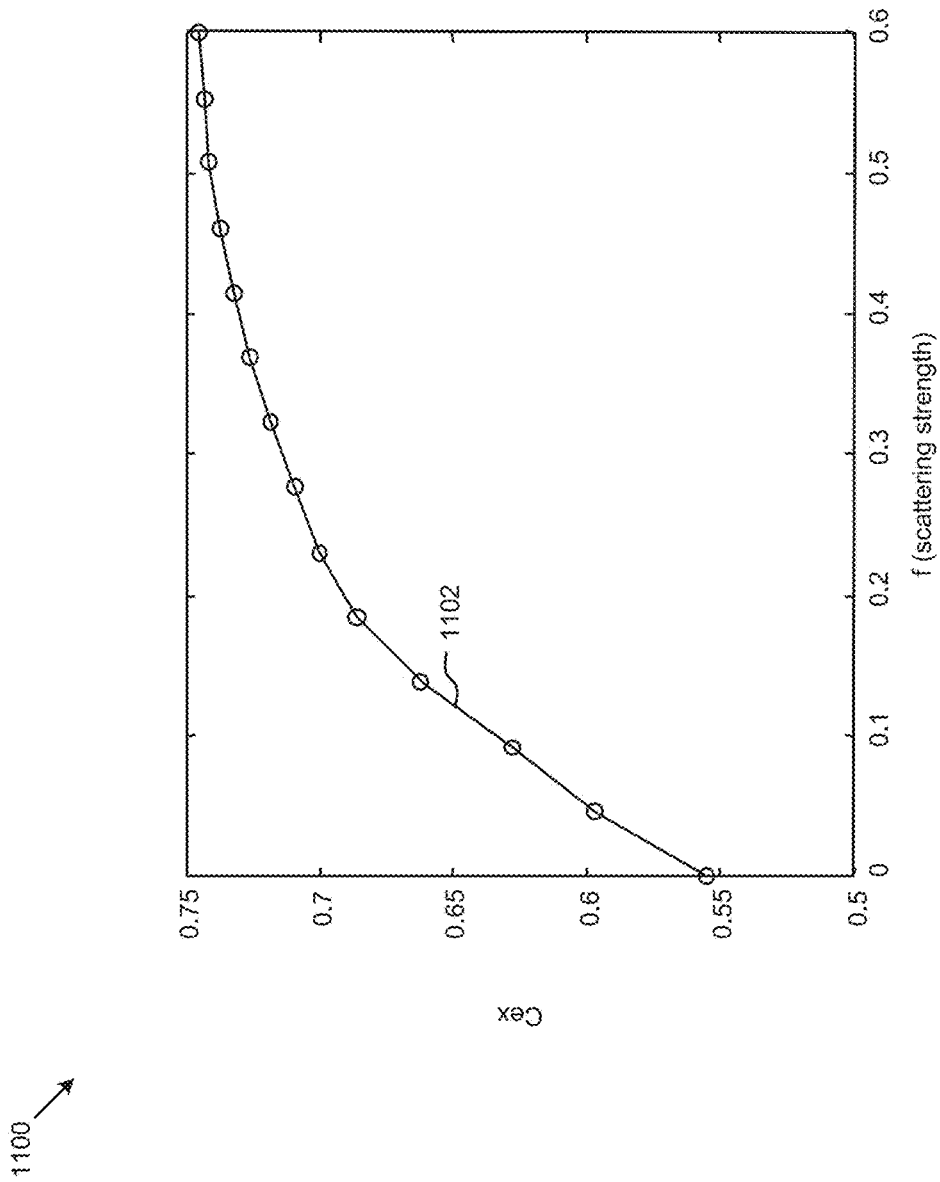
FIG. 11 is a chart showing light extraction as a function of varied polar and azimuthal angles for top surface-roughness for a volumetric chip for achieving high-performance light extraction from a Group III-nitride volumetric LED chip using surface roughening, according to some embodiments.

FIG. 11 is a chart showing light extraction as a function of varied polar and azimuthal angles for top surface-roughness for a volumetric chip for achieving high-performance light extraction from a Group III-nitride volumetric LED chip using surface and sidewall roughening. As an option, the present model light extraction as a function of varied polar and azimuthal angles for top surface-roughness for a volumetric chip may be implemented in the context of the architecture and functionality of the embodiments described herein.

FIG. 11 shows the total extraction efficiency of a volumetric surface roughness, as the scattering efficiency of the top roughness is varied (see line 1102). The extraction saturates for larger values of the scattering efficiency, because the top roughness never fully breaks quasi-guided trajectories. Here we used the roughness filling fraction as the scattering parameter. A similar result is obtained when increasing the size of the scattering features from ~500 nm to ~1.5 μm. Therefore efficient scattering requires a filling fraction which is high enough (typically >0.5) and a feature size which is large enough (typically ~1 μm). However even using an optimized roughness, light extraction remains limited. FIG. 11 shows Cex vs. top surface roughness for a GaN LED with a triangular base (lateral dimension 380 μm, height 200 μm) and with top surface roughness.

Sidewall-Roughened Volumetric Chips

In order to further increase light extraction, one can modify the sidewall facets in order to break these quasi-guided trajectories. This can be done by texturing of the sidewall facets. One way to texture the sidewalls is to produce 1-dimensional roughness, such as vertical striations. Such striations can naturally be obtained by using a die cleaving method along a proper crystal plane.

Figure 12:
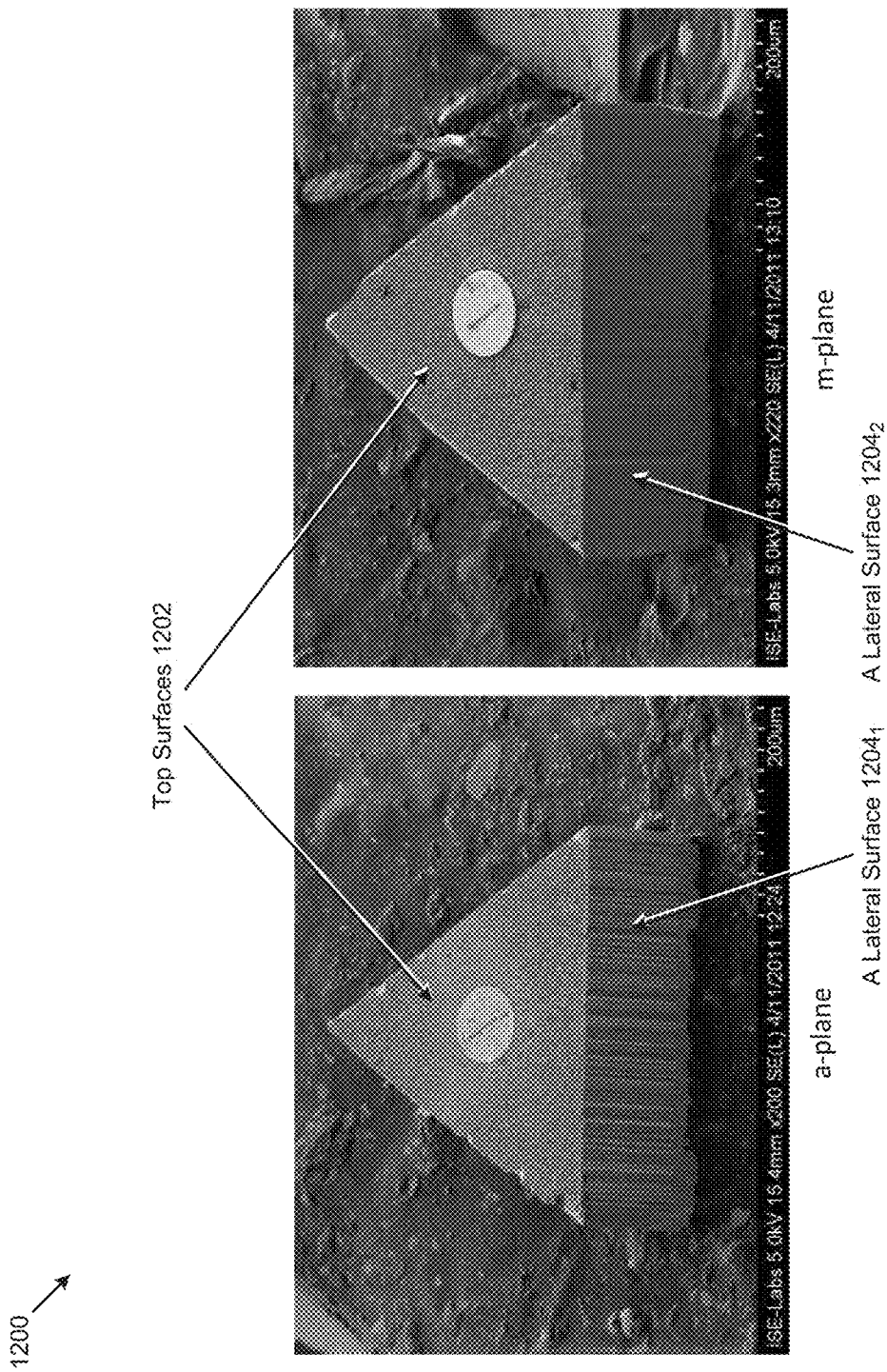
FIG. 12 shows images of LED chips formed by various cleaving along different crystallographic planes, according to some embodiments.

FIG. 12 depicts an image of LED die formed by various cleavings along different crystallographic planes. As an option, the present technique of cleaving along different crystallographic planes may be implemented in the context of the architecture and functionality of the embodiments described herein.

FIG. 12 shows the sidewall morphology for two LEDs on bulk GaN substrates which were cleaved with the same method but along two different crystal planes (a-plane and m-plane, as shown). The natural sidewall roughness obtained in a-plane devices translates experimentally into higher light extraction efficiency. Such roughness is expected to increase light extraction by breaking the three-fold in-plane symmetry of light propagation in the chip (e.g., by randomizing the azimuthal angle of propagation ϕ). FIG. 12 shows scanning electron microscope images of triangular chips cleaved along different crystallographic planes of a GaN substrate. The m-plane chip has relatively smooth sidewalls (e.g., lateral surface $1204_2$) while the a-plane chip has pronounced one-dimensional roughness on its lateral surfaces (see lateral surface $1204_1$).

Figure 13:
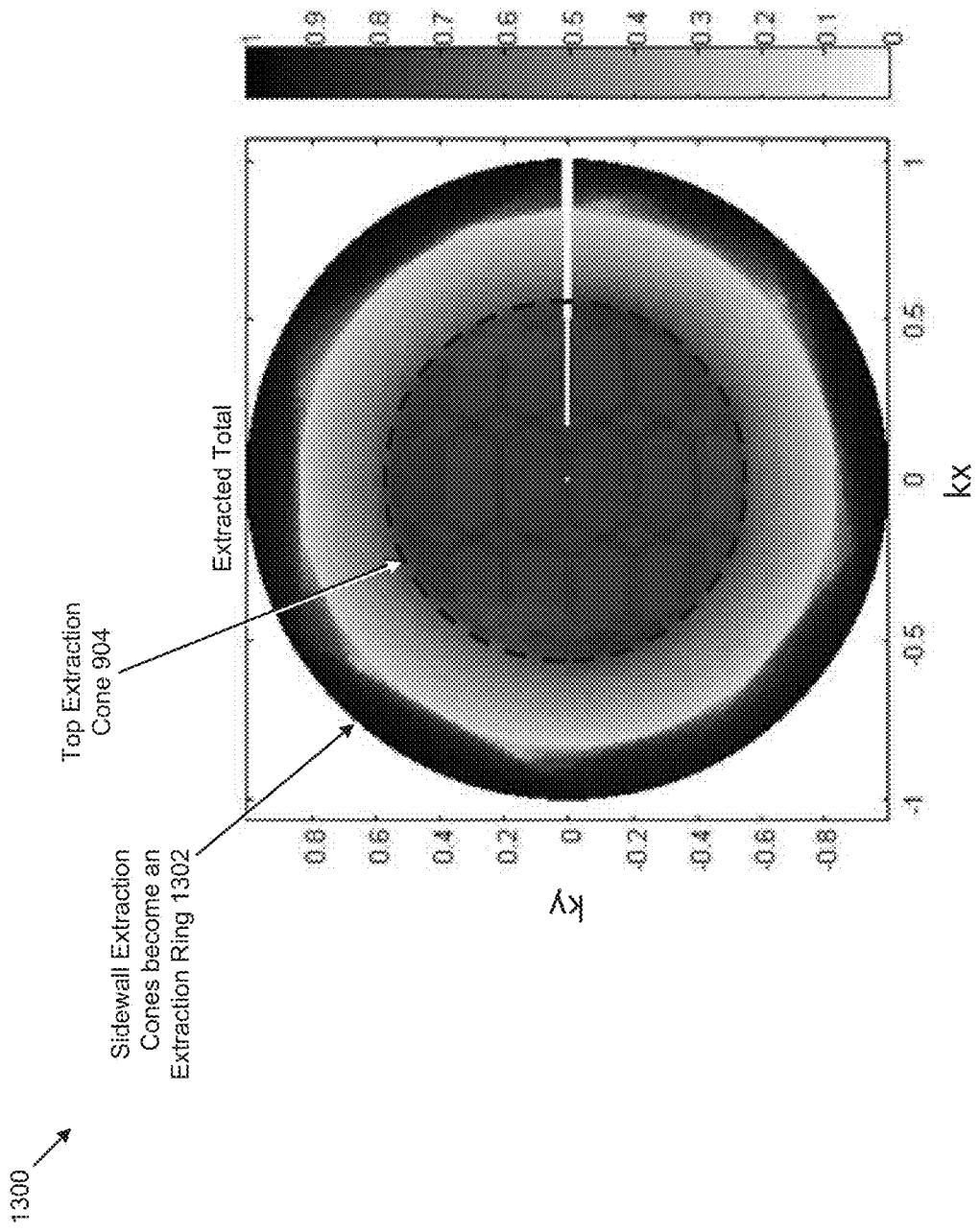
FIG. 13 is a chart showing light extraction as a function of varied polar and azimuthal angles for 1D roughened sidewall surfaces for a volumetric chip for achieving high-performance light extraction from a Group III-nitride volumetric LED chip using surface and sidewall roughening, according to some embodiments.

FIG. 13 is a chart showing light extraction as a function of varied polar and azimuthal angles for 1D roughened sidewall surfaces for a volumetric chip for achieving high-performance light extraction from a Group III-nitride volumetric LED chip using surface and sidewall roughening. As an option, the present model for light extraction as a function of varied polar and azimuthal angles for 1D roughened sidewall surfaces for a volumetric chip may be implemented in the context of the architecture and functionality of the embodiments described herein.

FIG. 13 shows how the angle-resolved extraction diagram of a chip is modified by randomizing the in-plane angles. Some quasi-guided trajectories are broken, resulting in larger extraction efficiency. As seen on FIG. 13 however, the polar propagation angles are not randomized (because the sidewall roughness is vertical, and thus does not break symmetry in the vertical direction) and some quasi-guided trajectories remain for intermediate angles. Another way to texture the sidewalls is to introduce a two-dimensional texture—e.g., to break the planarity of the sidewalls along two directions. FIG. 13 shows details of extraction vs. polar (q) and azimuthal (f) angles, for a volumetric chip with a triangular base (lateral dimension 380 μm, height 200 μm) with top surface roughness and 1D sidewall roughness. Due to randomization of (f), extraction is improved for some large angles. The six side extraction cones effectively become an extraction ring 1302. Extraction is still limited at intermediate angles.

Figure 14:
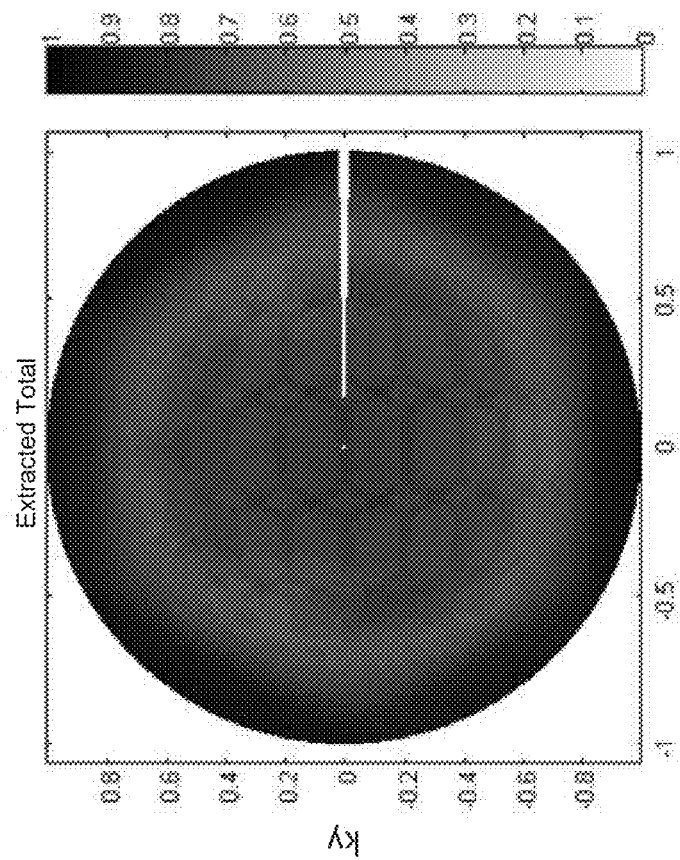
FIG. 14 is a chart showing light extraction as a function of varied polar and azimuthal angles for 2D roughened sidewall surfaces for a volumetric chip having a triangular base for achieving high-performance light extraction from a Group III-nitride volumetric LED chip using surface and sidewall roughening, according to some embodiments.

FIG. 14 is a chart showing light extraction as a function of varied polar and azimuthal angles for 2D roughened sidewall surfaces for a volumetric chip having a triangular base for achieving high-performance light extraction from a Group III-nitride volumetric LED chip using surface and sidewall roughening. As an option, the present model for light extraction as a function of varied polar and azimuthal angles for 2D roughened sidewall surfaces for a volumetric chip having a triangular base may be implemented in the context of the architecture and functionality of the embodiments described herein. FIG. 14 shows details of extraction vs. polar (q) and azimuthal (f) angles, for a volumetric chip with a triangular base (lateral dimension 380 μm, height 200 μm) with top surface roughness and 2D sidewall roughness. All angles are efficiently randomized, either by the top or the sidewall roughness, resulting in high extraction at all angles.

FIG. 14 shows the corresponding light extraction diagram. In such a case, both polar and azimuthal angles are randomized upon incidence on the textured sidewall, which can further increase light extraction. Extraction is substantially improved over some embodiments following the light extraction model of FIG. 13, especially in certain angular domains.

Figure 15:
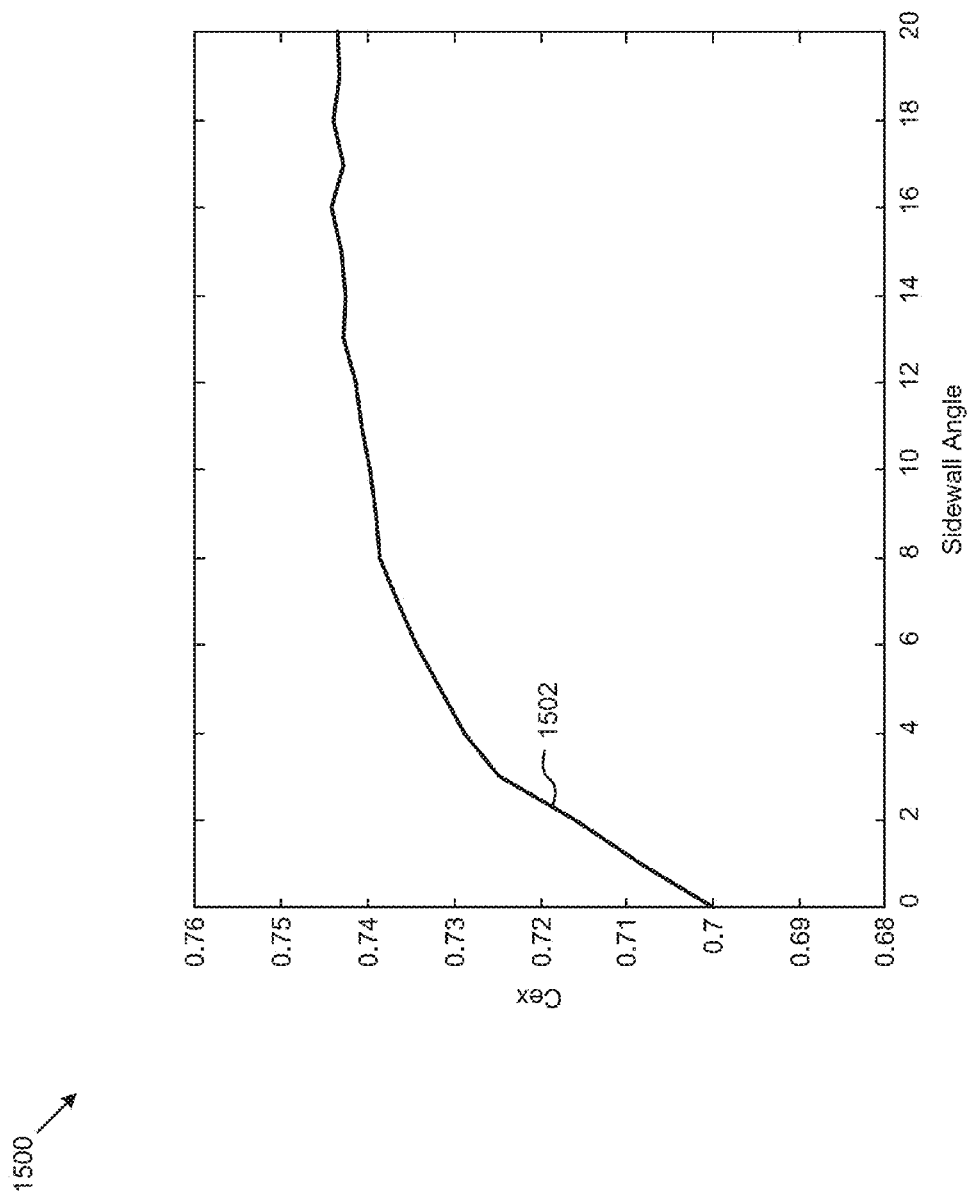
FIG. 15 is a chart showing light extraction for 1D roughened sidewall surfaces as a function of sidewall angle for a volumetric chip having a triangular base for achieving high-performance light extraction from a Group III-nitride volumetric LED chip using surface and sidewall roughening, according to some embodiments.
Figure 16:
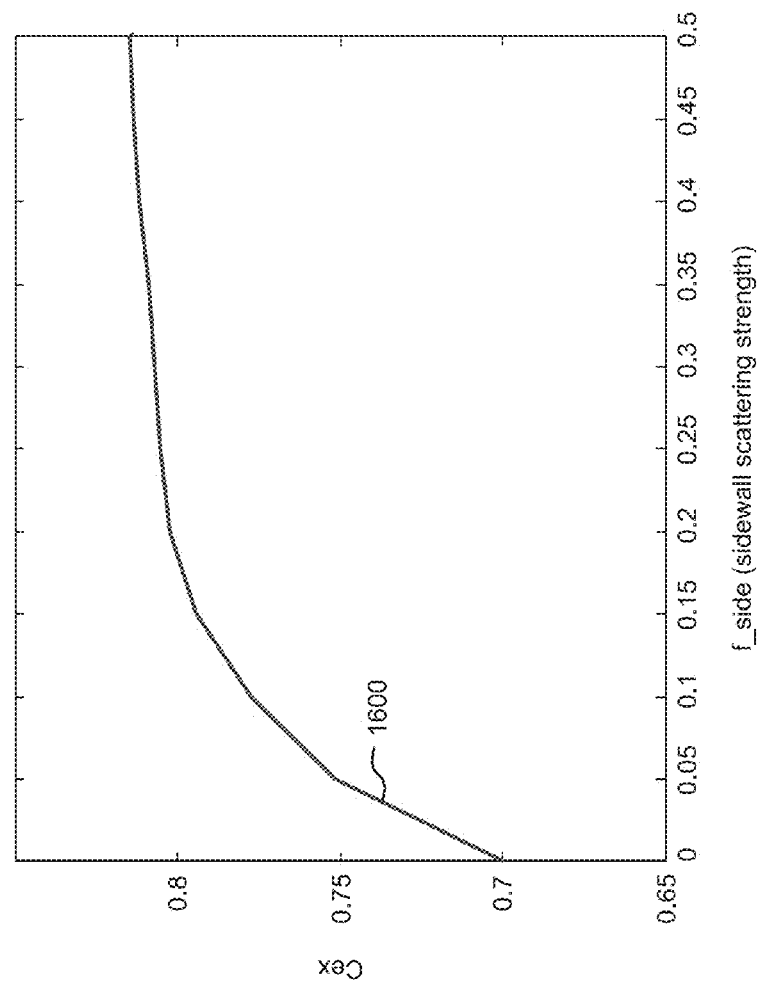
FIG. 16 is a chart showing light extraction for 2D roughened sidewall surfaces as a function of sidewall angle for a volumetric chip having a triangular base for achieving high-performance light extraction from a Group III-nitride volumetric LED chip using surface and sidewall roughening, according to some embodiments.

FIG. 15 and FIG. 16 exemplify the improvement in extraction efficiency predicted by implementing 1-dimensional and 2-dimensional sidewall roughening. With the loss parameters chosen, the extraction efficiency for a chip with only top roughness is 70%. 1D and 2D sidewall roughness boost extraction to ~74% and ~82%, respectively.

FIG. 15 is a chart showing light extraction for 1D roughened sidewall surfaces as a function of sidewall skewing angle for a volumetric chip having a triangular base for achieving high-performance light extraction from a Group III-nitride volumetric LED chip using surface and sidewall roughening. As an option, the present model for light extraction for 1D roughened sidewall surfaces as a function of sidewall angle for a volumetric chip having a triangular base may be implemented in the context of the architecture and functionality of the embodiments described herein. FIG. 15 shows Cex vs. one-dimensional sidewall roughness (the x-axis of this plot is the average angle of the sidewalls with respect to planar sidewalls) for a GaN LED with a triangular base (lateral dimension 380 µm, height 200 µm) and with top surface roughness (see line 1502).

FIG. 16 is a chart showing light extraction for 2D roughened sidewall surfaces as a function of sidewall angle for a volumetric chip having a triangular base for achieving high-performance light extraction from a Group III-nitride volumetric LED chip using surface and sidewall roughening. As an option, the present model for light extraction for 2D roughened sidewall surfaces as a function of sidewall angle for a volumetric chip having a triangular base may be implemented in the context of the architecture and functionality of the embodiments described herein. FIG. 16 shows Cex vs. two-dimensional sidewall roughness for a GaN LED with a triangular base (lateral dimension 380 µm, height 200 µm) and with top surface roughness.

In comparing the light extraction of FIG. 15 to the light extraction of FIG. 16, the improvements can be seen.

Figure 17:
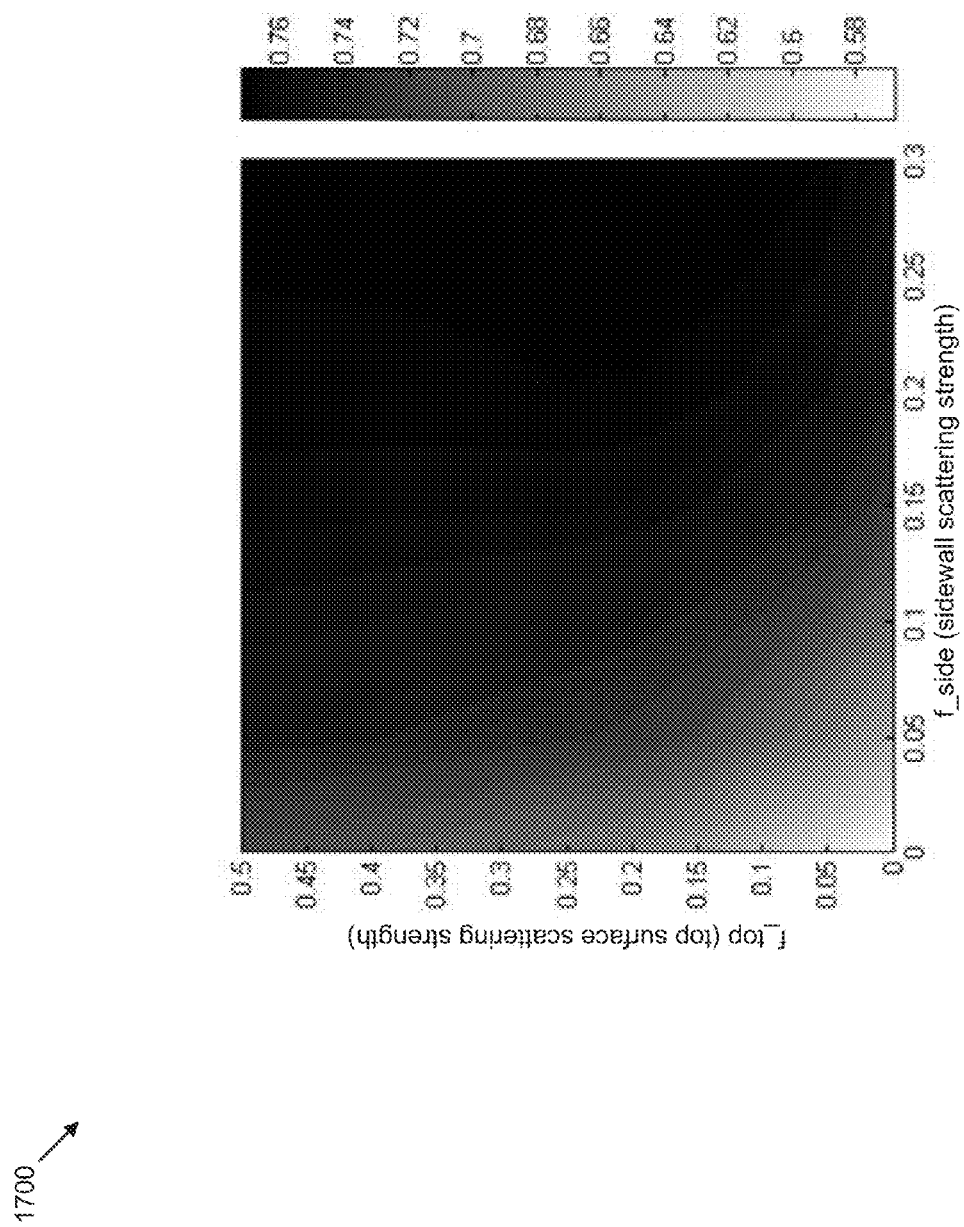
FIG. 17 is a chart showing light extraction under varied sidewall and top roughness for a volumetric chip having a triangular base for achieving high-performance light extraction from a Group III-nitride volumetric LED chip using surface and sidewall roughening, according to some embodiments.

FIG. 17 is a chart showing light extraction under varied sidewall and top roughness for a volumetric chip having a triangular base for achieving high-performance light extraction from a Group III-nitride volumetric LED chip using surface and sidewall roughening. As an option, the present model for light extraction under varied sidewall and top roughness for a volumetric chip having a triangular base may be implemented in the context of the architecture and functionality of the embodiments described herein.

FIG. 17 shows a 2-dimensional map of expected improvement by combining surface roughness and 2D sidewall roughness, for a variety of scattering strengths. Typical top surface roughness obtained by chemical or PEC etching can be described by a scattering strength f>0.4. Therefore, complementing such a top surface roughness with a moderate sidewall roughness f>0.15 is sufficient to achieve optimal extraction. FIG. 17 shows Cex vs. sidewall and top roughness for a GaN LED with a triangular base (lateral dimension 380 µm, height 200 µm) and with 2-dimensional top and sidewall surface roughness.

In the following embodiments, "texturization" or "roughness" describes an optical surface which deviates from planarity. The roughness may be random, periodic (as in the case of a photonic crystal for instance) or pseudo-periodic. The roughness may be produced by a variety of means, including chemical etching, electro-chemical etching, photo-electro-chemical etching, patterning and dry etching, regrowth of semiconductor material over a patterned interface, roughness due to a sawing/cleaving/laser scribing singulation process.

In one embodiment, the singulation process (which may combine laser scribing, sawing and cleaving) produces sidewall roughness.

In one embodiment, the present method and device includes a gallium and nitrogen (e.g., GaN) containing substrate having roughened regions vertically oriented with respect to a pair of electrode faces. In an embodiment, the electrode faces are configured on a c-plane. Preferably, the substrate is separated by way of scribing, which occurs using a laser scribing process having a short wavelength laser. The beam ablates by pulsing electromagnetic radiation on selected portions of the gallium and nitrogen containing substrate. The beam scribes the substrate along the a-plane. Preferably, the streets between devices are configured from about 1 micron to about 30 microns, although there can be variations. Each of the scribe regions has a width of 5 microns to 10 microns. The scribe regions are formed using a UV laser configured with a 355 nm source and an output power of 30 mW to 300 mW, but there can be other configurations. The laser pulses are in the nanosecond regime, e.g., 2 ns to 100 ns. The laser device and beam ablates a portion of the gallium and nitrogen containing material. The devices are later separated using a break process along the scribe lines causing formation of the roughened regions, which are substantially m-plane in characteristic and forms the vertically oriented facets. Each of the m-faces has width of a few microns, but can also be other dimension. Additionally, each of the facets has a peak region surrounded by troughs, when viewed from the c-plane direction. Optionally, the method subjects the scribe region to a selective etchant to remove any light absorbing slag material, which may be a by-product from the laser scribing process. Depending on the laser pulsing frequency, stage speed, and chemistry used for removing the by-product from the laser scribe process, a 2D roughness region with equal depth to the laser scribe can be created on the sidewalls of the device to greatly enhance light extraction. The selection of the chemistry for removal of the by-products is extremely important as some chemistry will tend to look for crystal plans and smooth out the region, while others induce roughness such as KOH. In some embodiments for creating 2D roughness regions, the process creates two distinct regions on the sidewalls.

In some embodiments, the same procedure as above is employed. However, the laser ablation process is sufficient to fully ablate the substrate and produce full device singulation, so that no subsequent breaking step is required. In such embodiments, the 2D roughness region created by the laser ablation covers a large fraction, up to the totality, of the sidewalls.

In some embodiments, the LED is made of bulk GaN and has the shape of a prism with a triangular base. The top surface and the sidewalls all display 2-dimensional roughness, with a roughness feature size on the order of 1-2 microns and a roughness surface coverage larger than 0.5.

In another embodiment, the LED is made of bulk GaN and has the shape of a prism with a triangular base. The top surface displays 2-dimensional roughness, with a roughness feature size on the order of 1-2 microns and a roughness surface coverage larger than 0.5. The sidewalls display vertical striations (1D roughness) with a characteristic distance of 1-5 µm.

Figure 18:
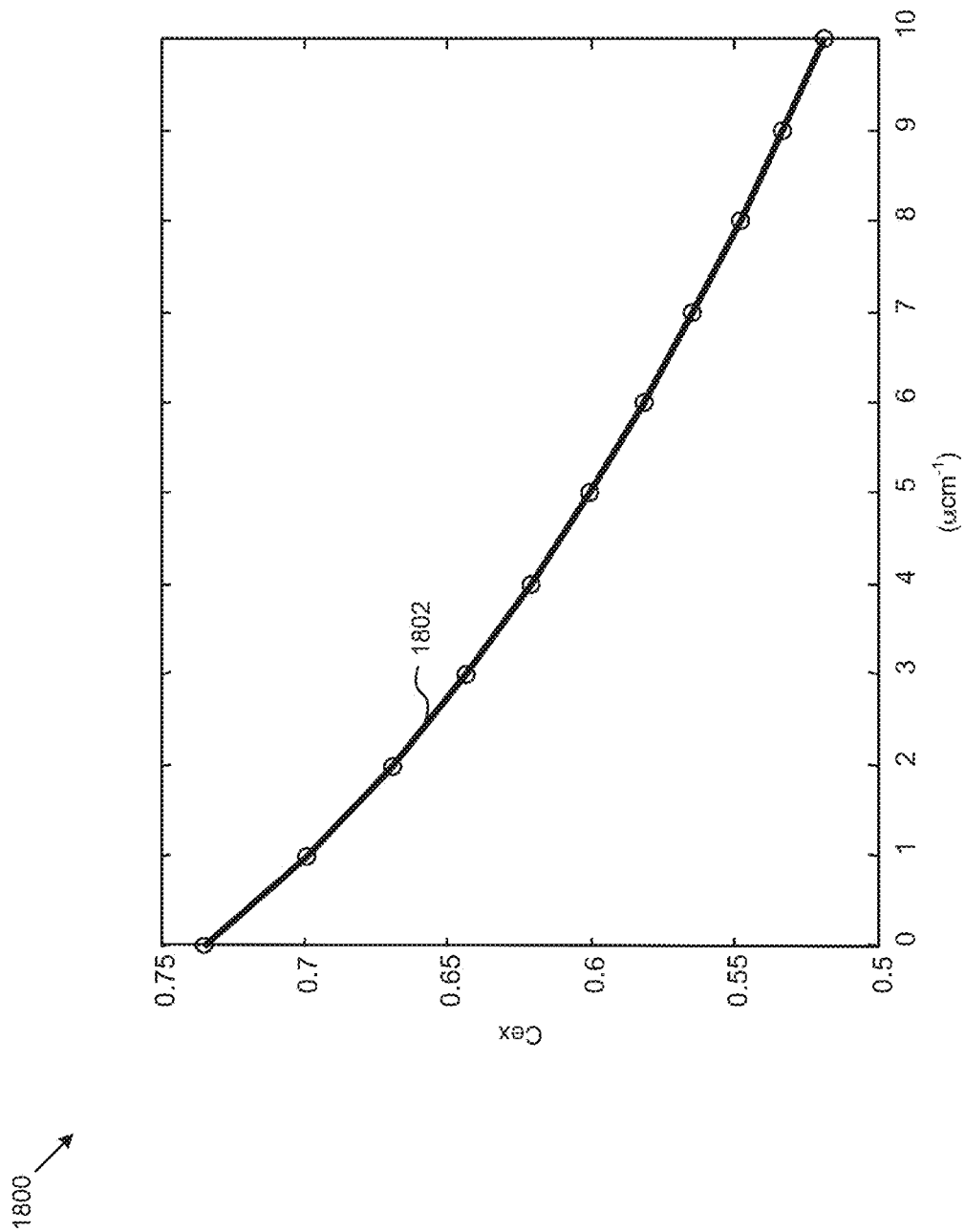
FIG. 18 is a chart showing light extraction under varied substrate absorption for a volumetric chip having a triangular base for achieving high-performance light extraction from a Group III-nitride volumetric LED chip using surface and sidewall roughening, according to some embodiments.

FIG. 18 is a chart showing light extraction under varied substrate absorption for a volumetric chip having a triangular base for achieving high-performance light extraction from a Group III-nitride volumetric LED chip using surface and sidewall roughening. As an option, the present light extraction model 1802 is plotted across varied substrate absorption for a volumetric chip having a triangular base.

FIG. 18 describes the impact of absorption coefficient on extraction efficiency. The Group III-nitride substrate has a crystal orientation such that its sidewalls can easily be roughened. FIG. 18 shows Cex vs. GaN substrate absorption a for a triangular chip (lateral dimension 380 µm, height 200 µm) with top surface roughness.

According to some embodiments:

Only some of the sidewalls are roughened.

The sidewalls are slanted and roughened.

The LED is grown on a bulk Group III-nitride substrate, and the resulting vertical-to-horizontal aspect ratio of the LED chip is larger than 5%.

The LED is grown on a foreign substrate, but the Group III-nitride layer is thick enough that the vertical-to-horizontal aspect ratio of the LED chip is larger than 5%.

The absorption coefficient of the Group III-nitride film is lower than 10 cm$^{-1}$, than 1 cm$^{-1}$.

Figure 19:
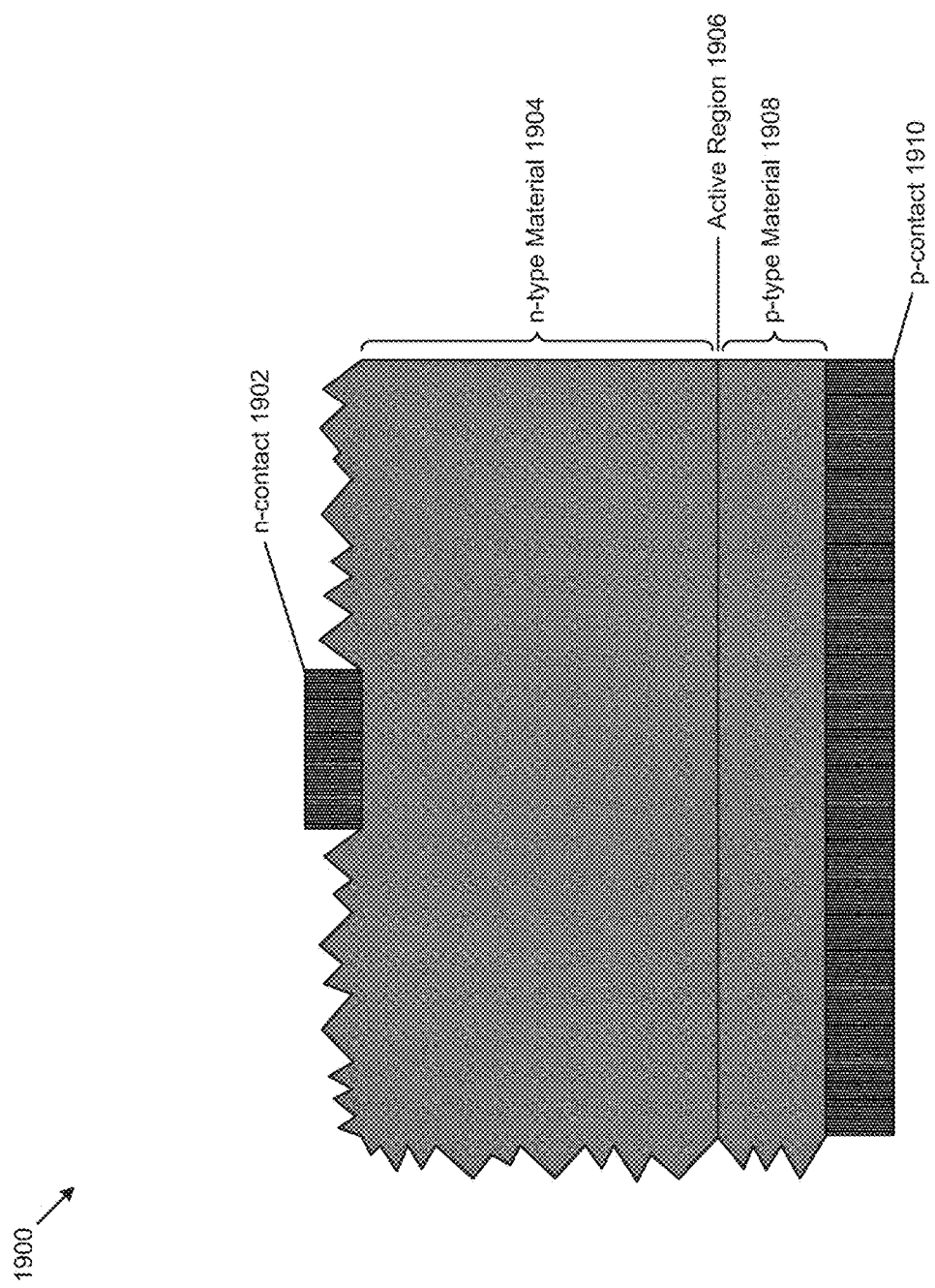
FIG. 19 is a simplified schematic diagram of a light emitting diode device having a top surface region with a textured surface characterized by a surface roughness of about 80 nm to about 10,000 nm; and a lateral surface region having a textured surface characterized by a surface roughness of about 80 nm to about 10,000 nm for achieving high-performance light extraction from a Group III-nitride volumetric LED chip using surface and sidewall roughening, according to some embodiments.

FIG. 19 shows a light emitting diode device having a top surface region with a textured surface characterized by a surface roughness of about 80 nm to about 10,000 nm; and a lateral surface region having a textured surface characterized by a surface roughness of about 80 nm to about 10,000 nm. As an option, the present light emitting diode device may be implemented in the context of the architecture and functionality of the embodiments described herein. Or, the present light emitting diode device or any characteristic therein may be preset in any desired environment. FIG. 19 shows a light emitting diode device having n-type material overlying an active region, in turn overlaying p-type epitaxial material. An n-contact is coupled to the n-type epitaxial material and a p-contact is coupled to the p-type epitaxial material. The top surface region has a textured surface characterized by a surface roughness of about 80 nm to about 10,000 nm; and at least one lateral surface region having a textured surface characterized by a surface roughness of about 80 nm to about 10,000 nm.

Figure 20:
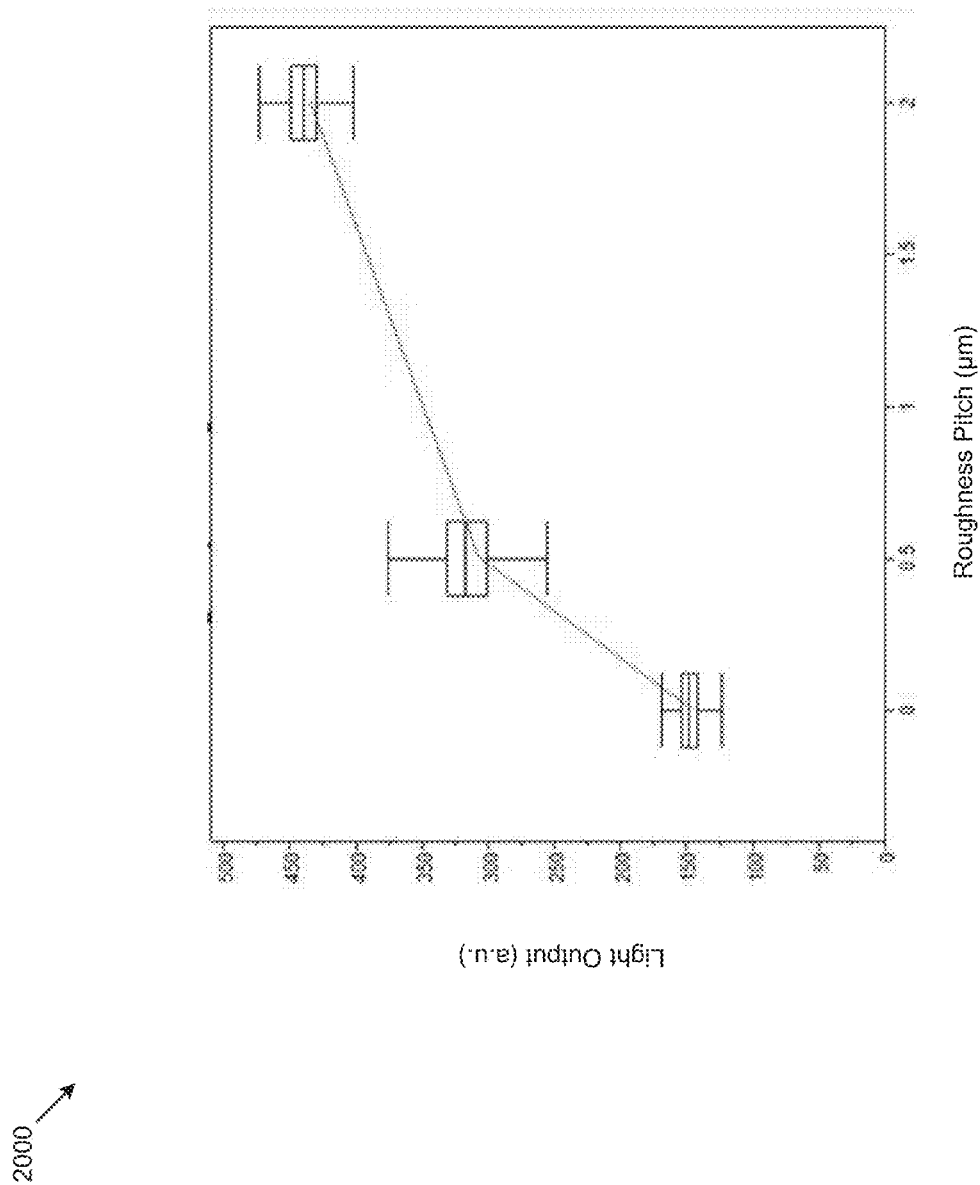
FIG. 20 shows light extraction as a function of roughness, according to some embodiments.

FIG. 20 shows light extraction as a function of roughness. Application of the surprising results as shown in FIG. 20 yields a technique for fabricating a light emitting diode device having roughened regions. Strictly as an example, fabricating a light emitting diode device having roughened regions can commence by providing a gallium and nitrogen containing substrate including a top surface region, a lateral surface region, an n-type epitaxial material overlying a portion of the top surface region. One or more active regions can be formed overlying the n-type epitaxial material, and p-type epitaxial material disposed to overly the one or more active regions. Then, a first electrode can be coupled to the n-type epitaxial material (or the substrate material), and a second electrode coupled to the p-type epitaxial material.

FIG. 20 shows performance for surface-roughened LEDs where the typical feature size of the roughness is varied. As observed in FIG. 20, increasing the feature size beyond 1 μm leads to an improvement in performance. This can be justified by considering scattering theory: scattering features smaller than the wavelength of light (e.g., ~400 nm) are in the Rayleigh scattering regime, where scattering increases with feature size. This leads to the trend observed on FIG. 20. This trend is expected to saturate as features become larger than 1 μm and scattering enters a geometric regime. Therefore, FIG. 20 suggests minimum feature sizes for a good surface roughness. Feature sizes larger than 1 μm provide the best scattering, while feature sizes in the range 100 nm to 1 μm provide a decent, although non-optimal, range.

Likewise, there is a practical maximum for the feature size which is desirable. Features of tens or hundreds of microns become comparable with the overall shape of the LED and can be impractical to form and handle. Therefore, the range 1 μm to 10 μm may be considered a preferred range because it leads to good scattering and is practical.

Various techniques can be used to form singulation regions, and various techniques can be used for separating at the singulation region boundaries. Optimizing said techniques can improve the roughness, and hence the extraction efficiency.

Figure 21:
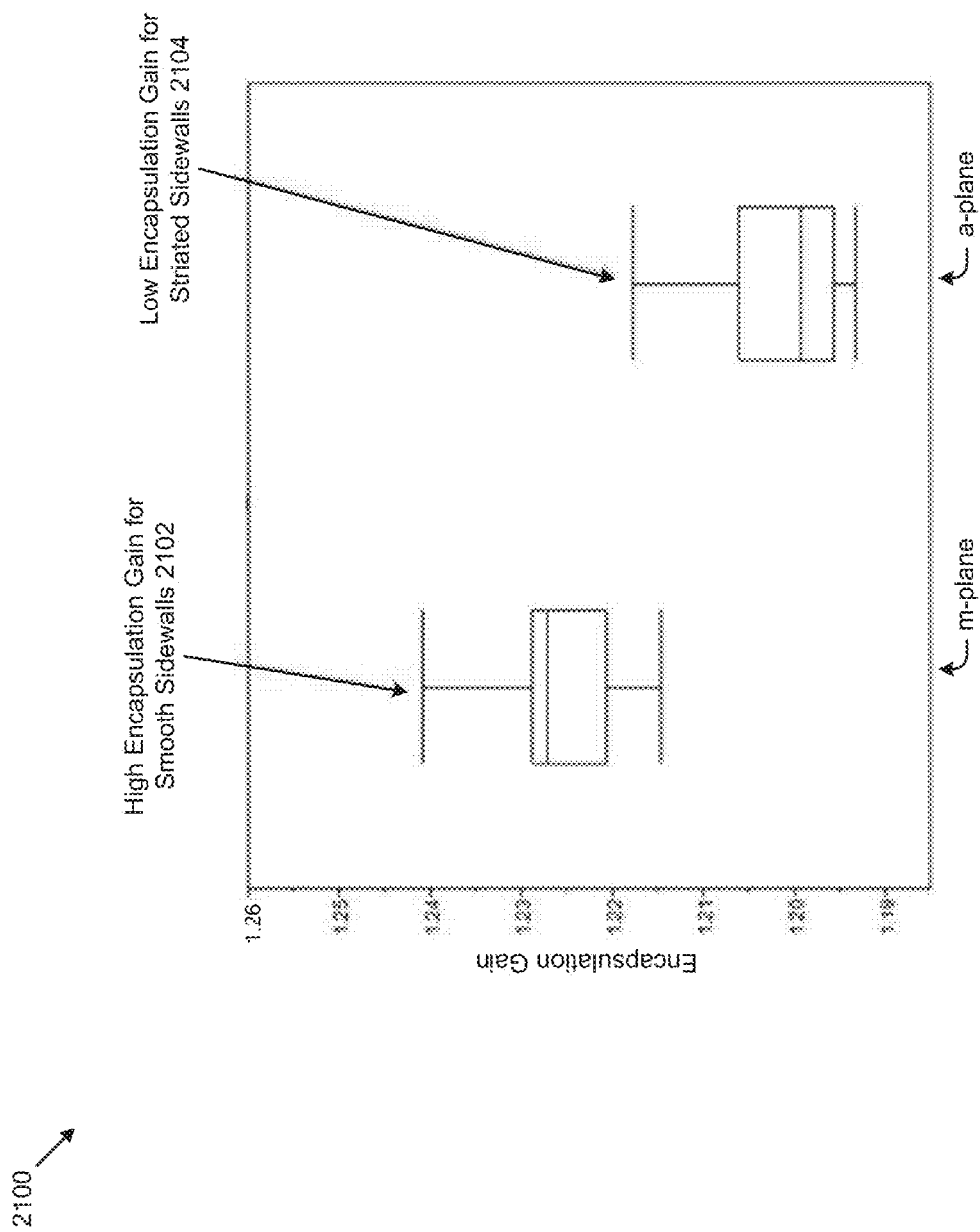
FIG. 21 shows the encapsulation gain performance of LED chips formed by various cleaving along different crystallographic planes, according to some embodiments.

FIG. 21 shows the encapsulation gain measured experimentally on LEDs similar to those of FIG. 12. FIG. 21 shows the encapsulation gain performance of devices cleaved with the same method but along two different crystal planes (a- and m-plane, as shown), similar to the devices of FIG. 12. Encapsulation gain is an indirect measure of extraction efficiency; a lower encapsulation gain indicates a higher extraction efficiency. FIG. 21 shows that a cleave along the a-plane, which produces deeper vertical roughness in the LED's sidewalls, leads to a lower encapsulation gain. The high encapsulation gain for smooth sidewalls 2102 (m-plane cleave) compares favorably to the low encapsulation gain for striated sidewalls 2104 (a-plane cleave).

Figure 22:
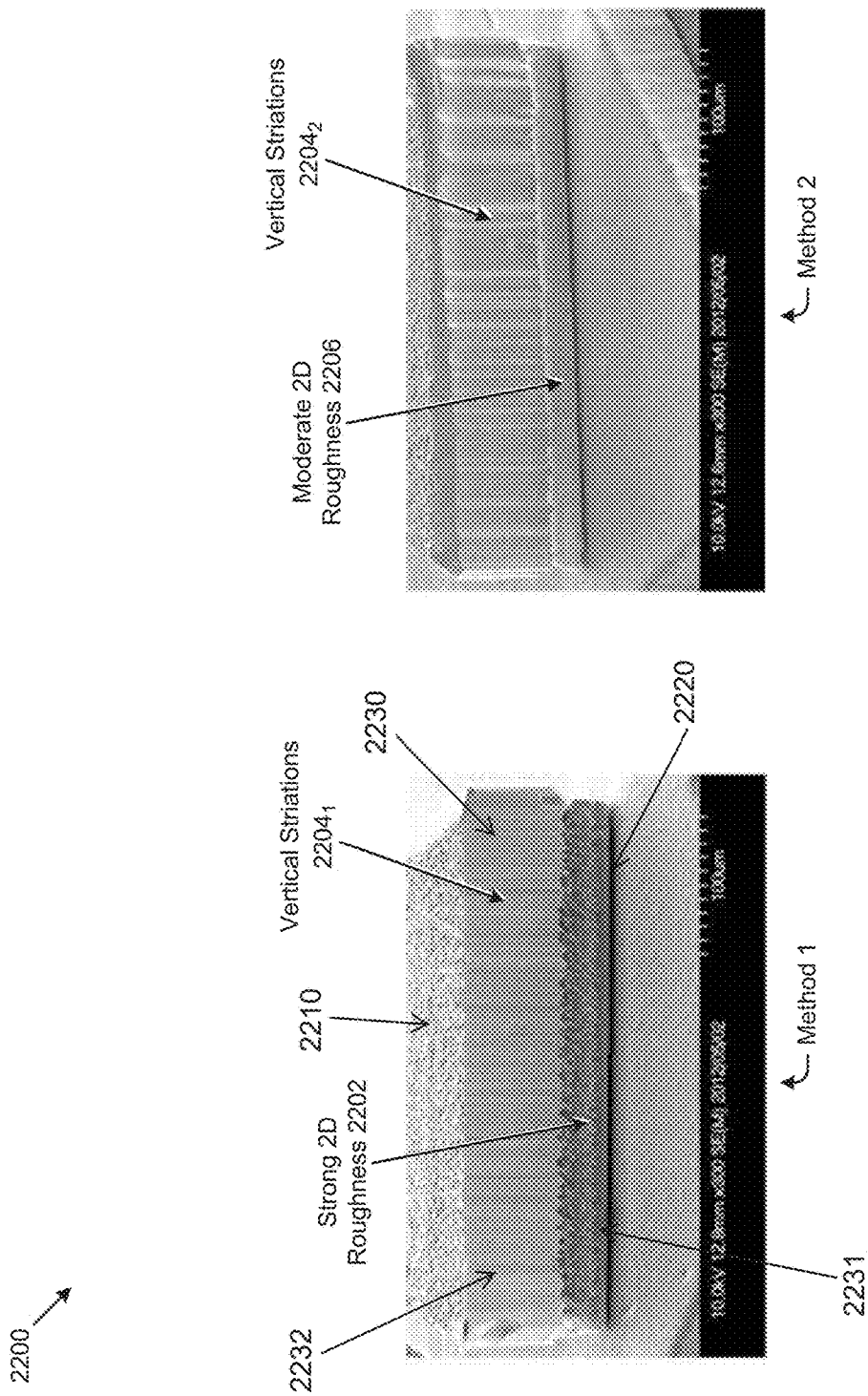
FIG. 22 depicts scanning electron microscope (SEM) images of LED chips formed by various laser scribing processes, according to some embodiments.

FIG. 22 compares SEM images of LED devices obtained by two singulation techniques. Each of the images shows a singulated LED having a top surface 2210, a bottom surface 2220, and a plurality of sidewalls 2230, at least one of said sidewalls 2230 comprising at least a first portion 2231 having a first texture and comprising at least a portion of laser-machined surface defined by a laser, and a second portion 2232 having a second texture, wherein at least one of said first and second textures are different or said first and second portions are non-planar.

The devices in FIG. 22 were singulated by using a laser scribing process followed by a breaking process. The two devices employed two methods. Each method uses a different laser beam profile during the laser scribing. Method 1 uses a multiple-beam profile; method 2 uses a single-beam profile. Due to the successive effect of the multiple beams as they are rastered along the scribing line, method 1 produces a strong 2-dimensional roughness 2202 in the laser-ablated region of first portion. Method 1, on the other hand, produces a moderate 2-dimensional roughness 2206 in the first portion.

In general, the parameters of the laser scribing process (such as the laser beam profile, rastering, pulse width and power) may be optimized to enhance the roughness in the laser-ablated region (e.g., see FIG. 28)

Figure 23:
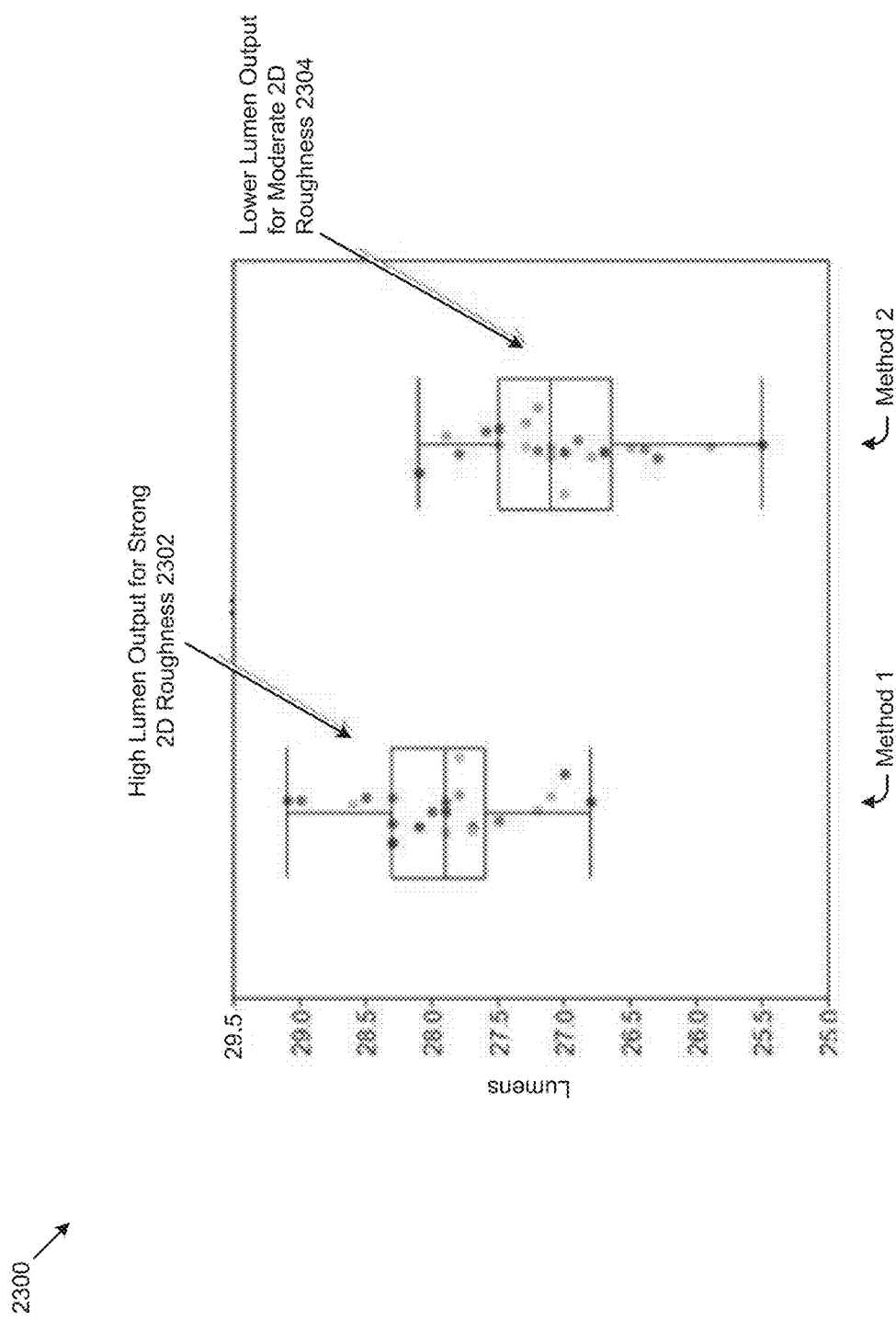
FIG. 23 shows the lumen output performance of LED chips formed by various laser scribing processes, according to some embodiments.

FIG. 23 compares the lumen output performance of white LEDs whose LED chips were obtained by two singulation techniques, as shown on FIG. 22. FIG. 23 shows that the LED produced by method 1 leads to a high lumen output for strong 2D roughness 2302 as compared with the shown lower lumen output for moderate 2D roughness 2304.

Figure 24A:
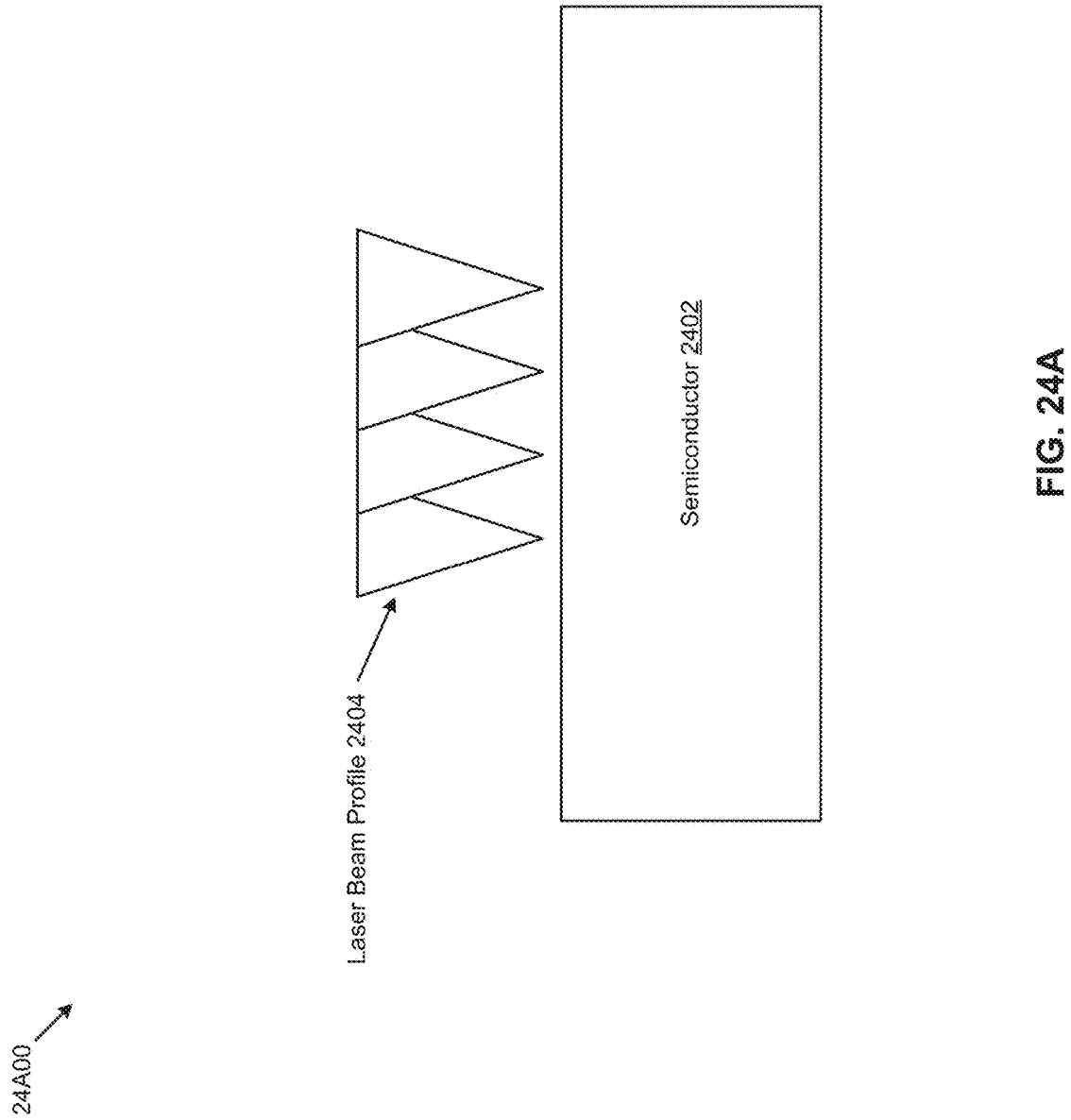
FIG. 24A shows the beam profile of a multiple-beam laser ablation tool used in the singulation process of LEDs.

FIG. 24A is a sketch of the laser beam profile of a laser-ablation tool. Such a profile may be used for fabricating embodiments of the invention. FIG. 24A shows a laser beam profile 2404 composed of several beams. This multiple-beam profile is rastered across a singulation direction. Rastering the same area of the semiconductor 2402 leads to a more pronounced roughness.

Some specifications according to some embodiments:

Vertical-to-horizontal chip aspect ratio >5%.

Average lateral size of rough features between 1 μm and 10 μm.

Average vertical size of rough features between 100 nm and 10 μm.

Average surface coverage of 2-dimensional rough features: top surface >0.5, sidewall >0.15.

A combination of sidewall and surface roughness, such that for any polar angle at least one of the surfaces has a one-bounce extraction efficiency into the outside medium larger than 10%.

Base shape of the LED can be a square, a triangle, a parallelogram.

The absorption coefficient of the Group III-nitride film is lower than 10 cm$^{-1}$. The embodiment of FIG. 18 describes the impact of absorption coefficient on extraction efficiency. Alternatively, some embodiments are characterized where the product of the typical chip dimension, and of the substrate coefficient, is smaller than 0.1. This can be understood to mean that the typical absorption through one light bounce in the chip will be less than 10%.

Figure 24B:
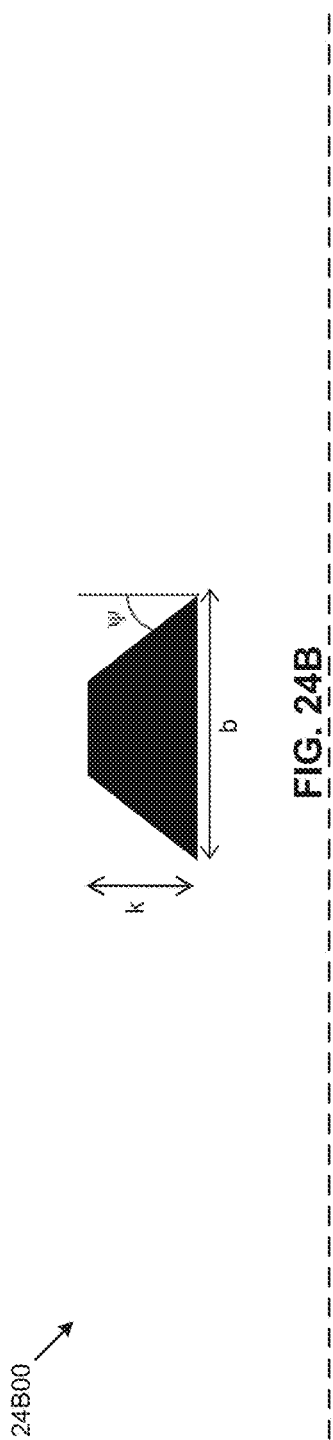
FIG. 24B depicts variations in chip shape geometry and corresponding impact on light extraction, according to some embodiments.
Figure 24C:
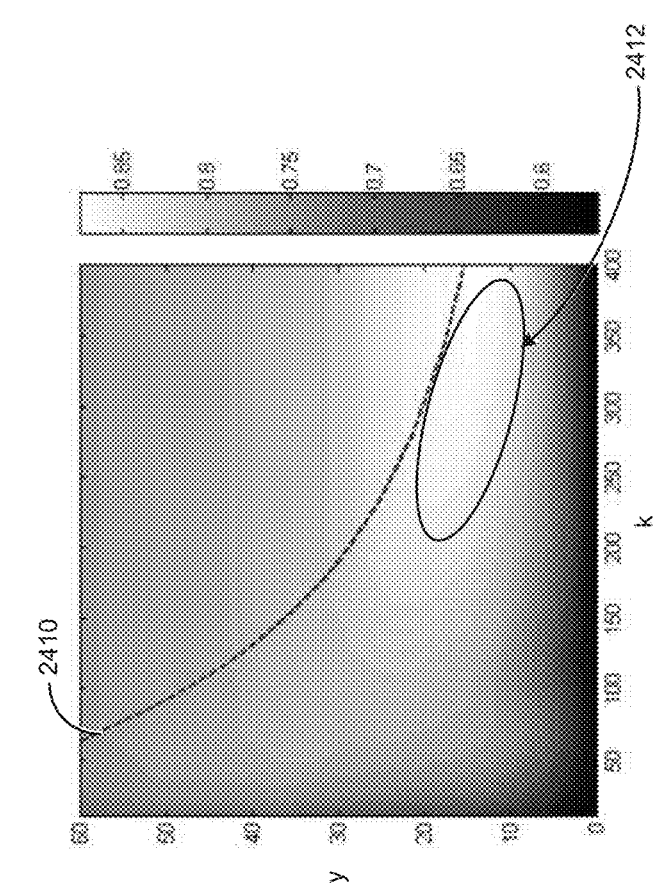
FIG. 24C depicts a light extraction plot as plotted across of range of chip shape geometries, according to some embodiments.

FIG. 24B and FIG. 24C depict variations in chip shape geometry and corresponding impact on light extraction. The geometry diagram 24B00 as shown in FIG. 24B depicts a shaped LED device showing height k and vertical sidewall angle ψ of a tetragonal chip (e.g., having a triangular base). As the height k increases, the vertical sidewall angle ψ decreases, with the vertical sidewall angle ψ approaching zero for a large value of height k (e.g., while holding the independent geometric variables constant).

FIG. 24C depicts a light extraction plot 24C00 as plotted across of range of chip shape geometries. As shown, the amount of light extraction is given in the range gradient, with range gradient ranges from about 0.6 (60%) to about 0.85 (85%) as shown. The highest light extraction can be obtained when vertical sidewall angle ψ is about 10° to about 25° and for a height k>200 µm. The corresponding highest light extraction range is shown in area 2412. The line 2410 corresponds to the maximum value of k for a given vertical sidewall angle ψ. The base width is shown as value b (which is 380 µm in the case of FIG. 24C). In exemplary embodiments, the value of b is in the range from about 50 µm to about 5 mm.

Figure 25:
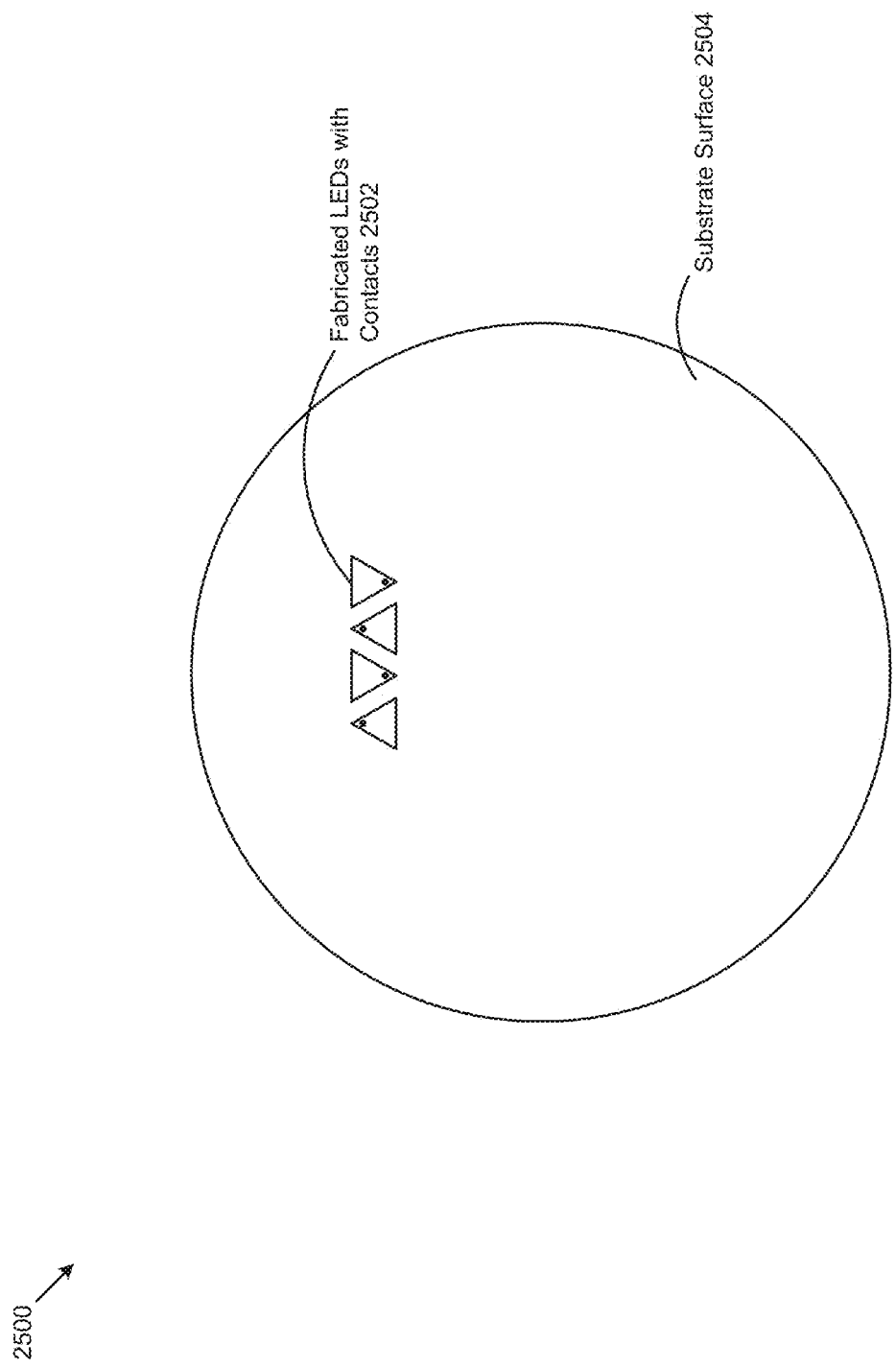
FIG. 25 a wafer having fabricated LEDs disposed on the substrate surface, according to some embodiments.

FIG. 25 depicts a wafer having fabricated LEDs with contacts 2502 disposed on the substrate surface 2504. In one embodiment, the LEDs are fabricated with contacts to the n-substrate and p-epi on the same surface, in a flip-chip configuration. The fabrication consists of multiple lithography, etch, metal deposition, and dielectric passivation steps to form the LED. After the fabrication of the LED device, the wafer is mounted with the metal contacts protected and the backside of the wafer exposed. In one embodiment, the wafer may be thinned and polished, for example by grinding, lapping, and polishing techniques, after mounting on a tape or carrier substrate such as sapphire. After polishing, the LED metallization pattern is visible through the back of the wafer as depicted in FIG. 25.

Figure 26:
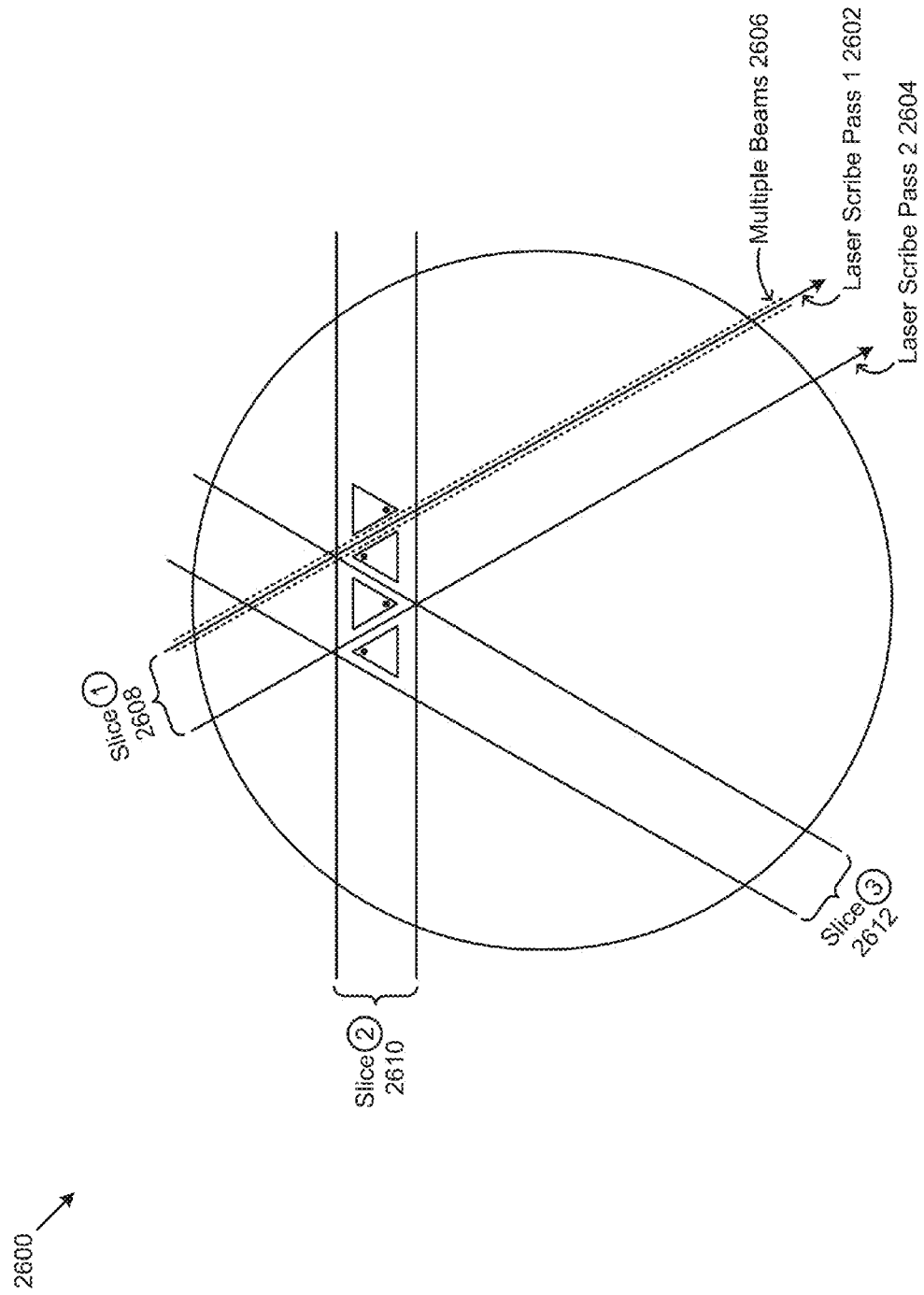
FIG. 26 shows a singulation technique that results die that has a triangular projection, according to some embodiments.

FIG. 26 shows a laser machining technique to form grooves/recesses in the wafer, thereby defining the scribe lines of singulation. The versatility of the laser facilitates a wide variety of recess configurations. For example, the recess may be a continuous groove, or it may comprise a series of non-continuous recesses—e.g., pits that provide a "perforation" line to facilitate singulation. In this embodiment, the laser scribing results die that has a truncated tetrahedral shape. The polished side of the wafer is exposed to a laser that ablates away a portion of the material in the regions near the edge of the die. A laser is scanned along the edges of each die, shown as slice 1, slice 2, and slice 3 so that a portion of the material along the edge of the LED is removed. The laser can be used to scribe, and multiple passes (e.g., laser scribe pass 1 2602, laser scribe pass 2 2604 and additional laser scribe passes (e.g., slice 1 2608, slice 2 2610 and slice 3 2612) can be performed so as to result in singulated die that each have a truncated tetrahedral shape. Multiple beams 2606 can be used to achieve sidewall shaping. Various techniques involving multiple beams are shown and discussed as pertaining to the following FIG. 27.

Figure 27A:
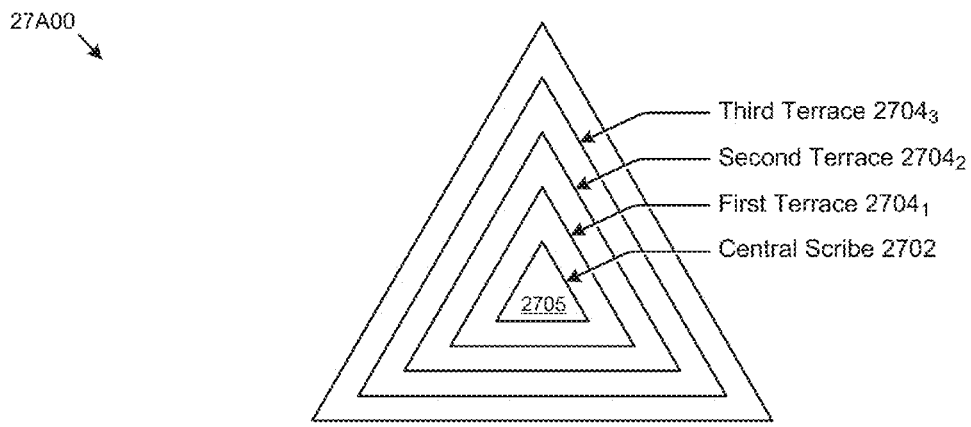
FIG. 27A depicts a top view of a die that has a triangular projection, according to some embodiments.

FIG. 27A depicts a method of scanning the laser to produce a die that has a shaped sides wall. The first portion of the sidewall which is defined at least in part by the recess, may also be configured in different ways, owing again to the versatility of the laser beam which may have a uniform power profile across the beam, or a non-uniform in power across its beam to shape the laser-machined surface. Additionally, the laser-machined surface can be prepared using multiple passes across the wafer to create a shaped laser-machined surface. Accordingly, the recess may be straight (e.g., V-groove), curved (e.g., U-groove) or multifaceted such that the first portion is likewise straight, curved or multifaceted/terraced.

In the particular embodiment of FIG. 27A, a truncated tetrahedral shape is disclosed. The laser beam is split into multiple beams with a sequence of different powers so as to produce ablation of different depths of material. Alternately, the same beam can be scanned multiple times along adjacent paths, adjusting the beam power for each pass. As shown, a first laser beam can be configured with a power to ablate through material to form a first terrace $2704_1$, a second laser beam can be configured with somewhat more power to ablate through more material to form a second terrace $2704_2$, a third laser beam can be configured with still more power so as to ablate through still more material to form a third terrace $2704_3$, and so on. The shaped die can include a triangular facet 2705, which can in turn be used as an area for deposition of electrically-conductive contact material. The number and juxtaposition of the terraces can be controlled by controlling material removal from the bulk substrate. Furthermore, the number and juxtaposition of the terraces can be controlled so as to result in a relatively larger or relatively smaller triangular facet 2705. A triangular facet 2705 can approximate a mesa, or a triangular facet 2705 can approximate a point-like triangular facet 2705.

The shaped die can be singulated using one or more scribes (e.g., central scribe 2702).

Figure 27B:
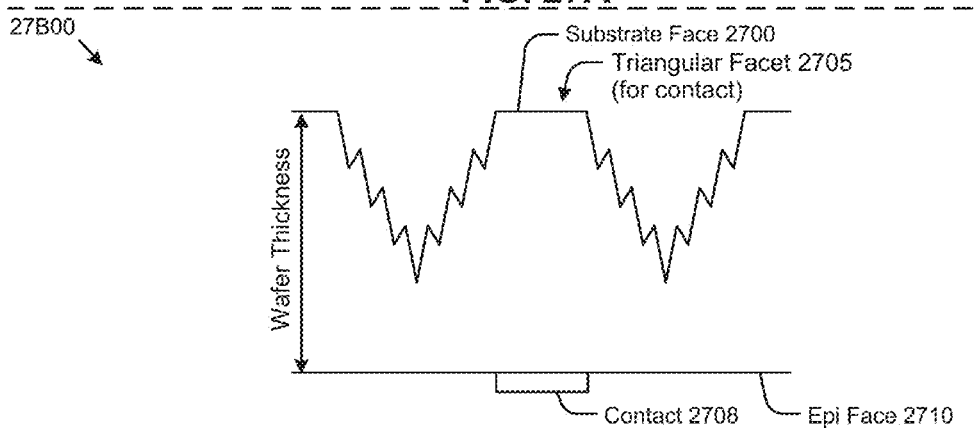
FIG. 27B depicts a side view of a die that has a triangular projection, according to some embodiments.

FIG. 27B, depicts a shaped die with a laser-scribed recess, which in this embodiment is a groove. The versatility of the laser facilitates a wide variety of recess configurations. For example, the recess may be a continuous groove or it may comprise a series of non-continuous recesses—e.g., pits that provide a "perforation" line to facilitate singulation. The first portion of the sidewall which is defined at least in part by the recess, may also be configured in different ways, owing again to the versatility of the laser beam which may have a uniform power profile across the beam, or a non-uniform in power across its beam to shape the laser-machined surface. Accordingly, the recess may be straight (e.g., V-groove), curved (e.g., U-groove) or multifaceted such that the first portion is likewise straight, curved or multifaceted. Additionally, the laser-machined surface can be prepared using multiple passes across the wafer to create a shaped laser-machined surface.

Referring back to FIG. 27B, a wafer can be processed to produce shaped dice that have a truncated tetrahedral shape. In this embodiment, the laser machined surface has terraces or grooves resulting from the exposure to the beam profile as shown in FIG. 27A. The angle of these grooves can be adjusted to optimize the light extraction. For example, the angle of the grooves can be controlled by adjusting the power in each of a set of beams and by adjusting the separation (e.g., pitch) between beams. The power may be adjusted by an optical element, or by adjusting the pulse width or period, or both. In one embodiment, the laser beam profile (e.g., a profile of spatial power distribution of the laser from each beam) can comprise a power profile having variations that are separated sufficiently so as to produce distinct terraces.

Figure 27C:
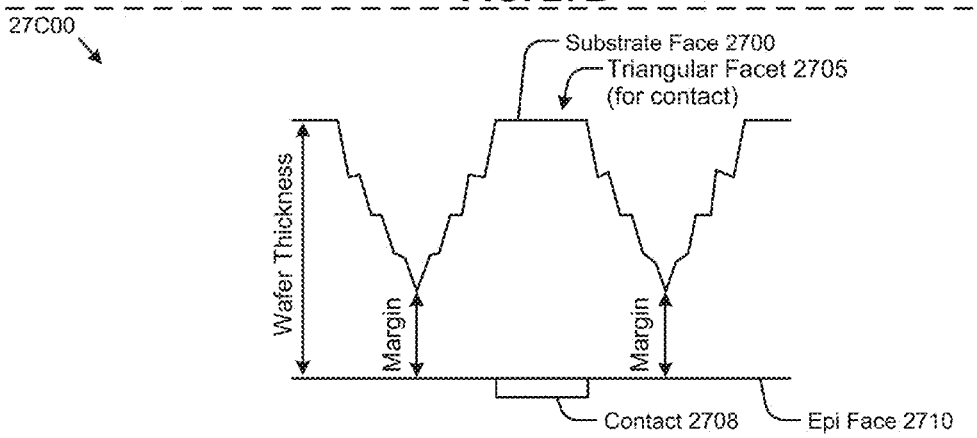
FIG. 27C depicts a side view of a die that has a triangular projection, according to some embodiments.

FIG. 27C depicts results of using one or more etching technique and/or one or more etching steps. Referring to the view 27C00 of FIG. 27C, a wafer can be processed by etching to produce a die with terraces that have been planarized between terrace levels. Accordingly, the sidewalls of the truncated tetrahedral shape can become substantially planar. Strictly to disclose examples of processing variables:

The thickness of the wafer can be measured from the epi face 2710 to the substrate face 2700.

Terraces can be formed in various pitches, ranks and depths.

As examples, given a wafer thickness of 150 um and given a pitch between laser beams=20 um, and given rank=5, then embodiments support depths of {20 um, 40 um, 60 um, 80 um, 100 um} or, if rank=4 then depths might be {25 um, 50 um, 75 um, 100 um}, or, if rank=4, then depths might be {30 um, 60 um, 90 um, 120 um}, etc.

The angles of structures forming the terraces can be reduced by etching.

The laser pitch and depth selected may require more or less time in post-ablation processing. A closer laser pitch requires less time to etch, but more time to scribe.

Using the disclosed laser ablation techniques, sidewalls can be formed to incline at any angle between about 10 degrees and about 70 degrees.

The aforementioned processing techniques to produce shaped dice that have a truncated tetrahedral shape with terraced or slanted sidewalls are merely examples. Other thicknesses of the wafer, other ranks, other depths of the ablation by the laser are reasonable, and do not depart from the scope of the invention. Strictly as one more example of reasonable ranges, the starting wafer can be of a thickness from 50 um to 300 um thick, the scribes formed by removal of material (e.g., by laser ablation) can be about 5 um wide and can range in depth (as shown) over a wide percentage of the wafer depth. In some cases the depth of a trench is as deep as 90% of the thickness of the wafer, in some cases, the depth of a trench is as shallow as a few percent of the thickness of the wafer. After laser scribing, the resulting shape of the die includes undulations (e.g., material has been removed by ablation) and a pattern of spires that are present between undulations. The spires can be etched away using hot KOH, resulting in a smoothing effect over the spires. Continued etching serves to further smooth the spires, which, after a controlled time period of etching, results in a sloped surface that form slanted sidewalls of the truncated tetrahedral shape.

Using such techniques, the slanted sidewalls can be formed to incline at any angle between about 10 degrees and about 70 degrees. As can be understood by those of ordinary skill in the art, the pitch between laser emitters that form the laser beam profile need not be uniformly or perfectly spaced. Moreover, the power delivered by the laser emitters that form the laser beam profile need not be uniformly or perfectly staggered.

Figure 29:
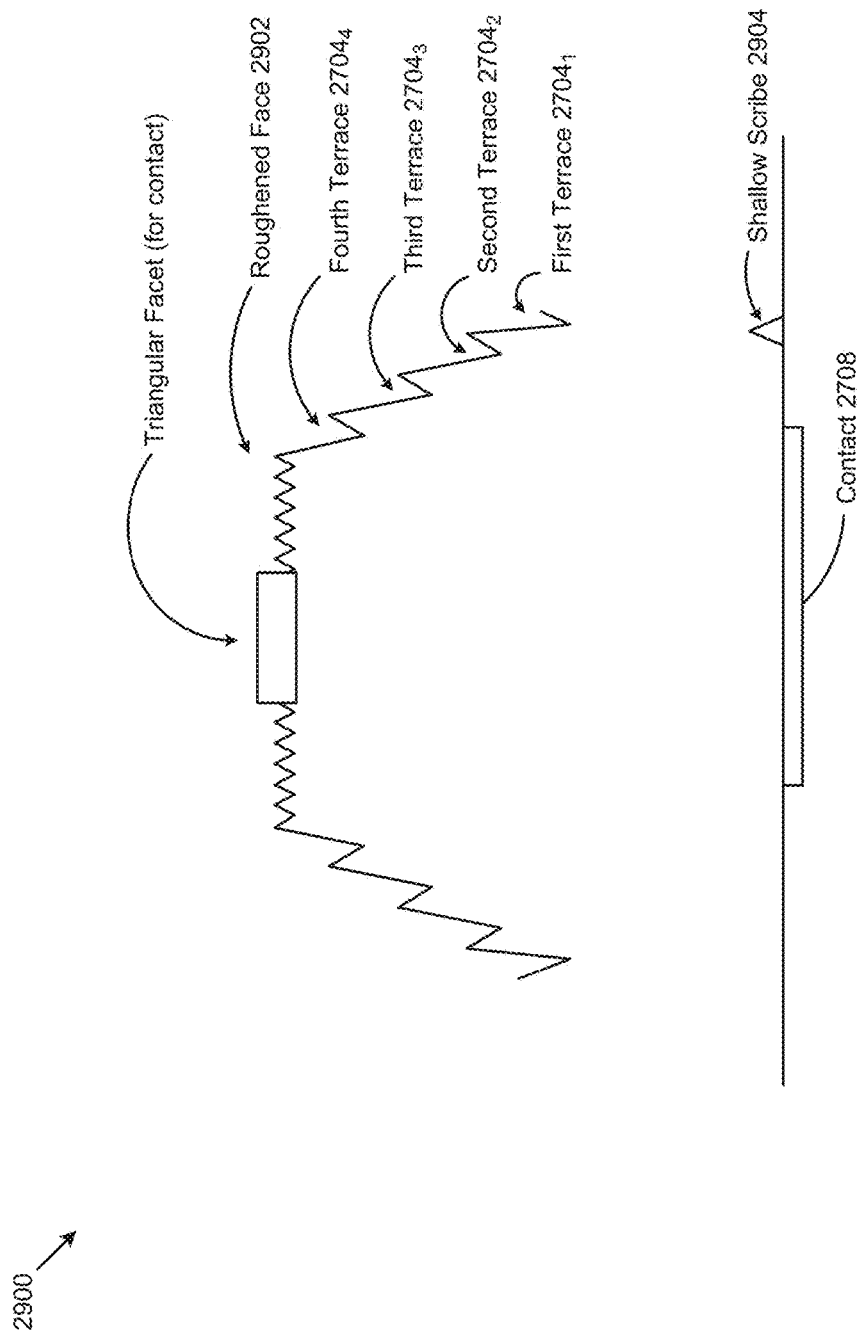
FIG. 29 shows a side view of a die that has a roughened face, according to some embodiments, according to some embodiments.

FIG. 28 shows process for using a staggered laser beam profile depicting variation of pulse width and power. Use of such a staggered laser beam profile 2802 can produce die having a truncated tetrahedral shape, such as is depicted in FIG. 29. Many such die can be produced on one wafer, and the die can be singulated using a shallow scribe. The shown laser beam profile 2802 is merely one particular configuration using one particular group of settings. A laser beam profile can be practiced by use of multiple laser emitters (e.g., each with an adjacent power configuration), or a laser beam profile can be practiced by use of multiple optical elements that serve to attenuate laser beam power taken from just one laser emitter. Further, any combination of one or more laser emitters and one or more optical elements can be used in any combination so as to produce multiple beams, each having an adjacent power setting.

FIG. 29 shows a side view of a wafer during processing to produce a die that has a truncated tetrahedral shape. In this embodiment, a second laser machining process is added to produce a shallow scribe 2904 on the side of the wafer with contacts. In one embodiment, the break process is applied such that the fracture separating the wafer into individual die starts near the side of the wafer with the shallow scribe so as to prevent the fracture from intersecting the LED device layers. The surfaces of such sidewalls are often roughened as a consequence of using the aforementioned GaN processing steps. Additionally, the surfaces of such sidewalls can be roughened using additional etching steps. The die can be singulated by any known method, including the methods as follows:

The wafer can be flipped over so as to expose the epi face 2710, and a shallow scribe can be made so as to facilitate singulation of the tetrahedral shaped die (also see FIG. 26).

The wafer can remain substrate face up, and a shallow scribe can be made so as to facilitate singulation of the tetrahedral shaped die (also see FIG. 26).

It is also possible to cingulate (e.g., fully or partially) before starting the terracing processes.

As aforementioned, some of the surfaces of a die (e.g., the slanted sidewalls) can be roughened using chemical techniques. Additionally, in certain situations, the processes of singulation can result in a base (e.g., see FIG. 24A, FIG. 24B, and FIG. 24C). The base might be striated, or might be subjected to processes so as to roughen the surfaces of the base.

Figure 30:
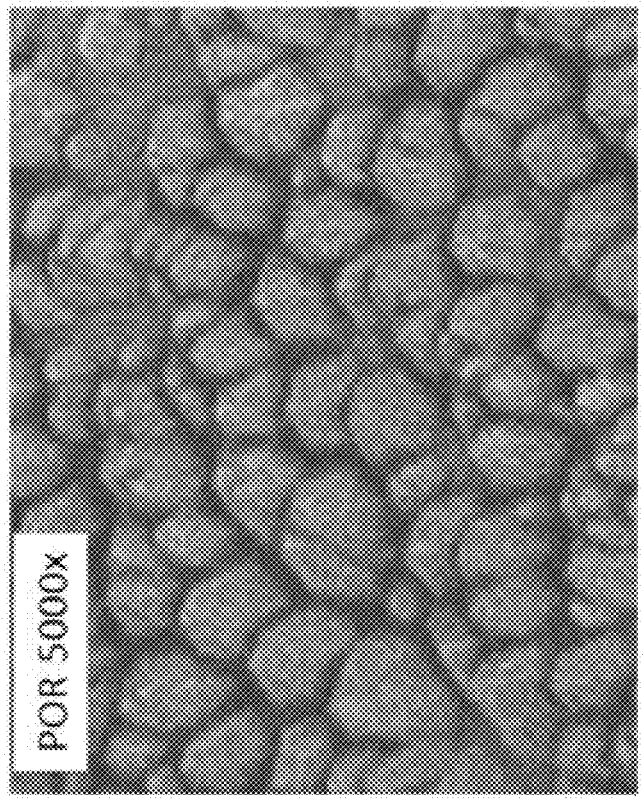
FIG. 30 exemplifies roughness when illumination techniques are used to roughen a face of an LED die, according to some embodiments.

FIG. 30 exemplifies surface roughness when photo-electrochemical techniques are used to roughen a face of an LED die. In this instance, the nitrogen face of the die is exposed to 9% KOH at 60° C. for 30 minutes, under illumination by an above-bandgap lightsource. The illumination accelerates the etching rate, and the m-plane facets are preferentially exposed due to their lower etching rate.

Figure 31A:
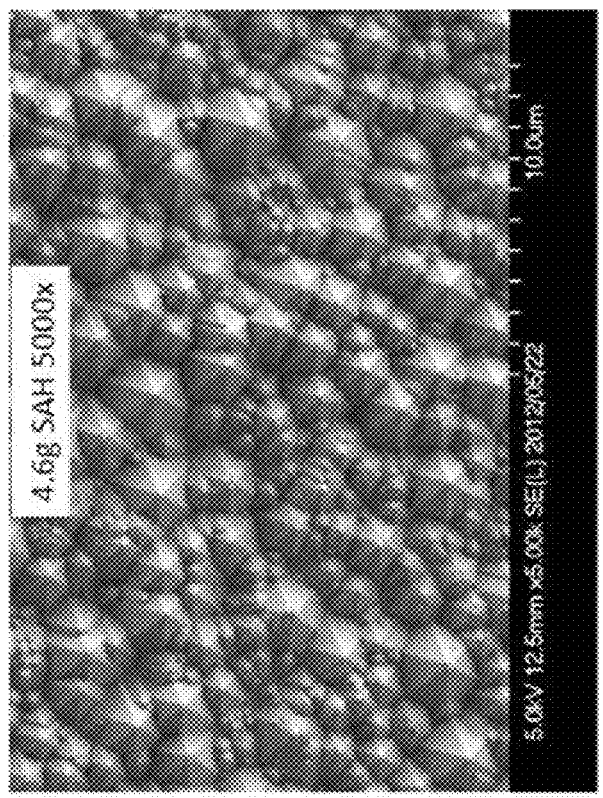
FIG. 31A exemplifies roughness when a lower concentration SAH chemical etching is used instead of illumination techniques to roughen a face of an LED die, according to some embodiments.

FIG. 31A exemplifies roughness when a lower concentration SAH chemical etching is used instead of illumination techniques to roughen a face of an LED die. In this embodiment, illumination is not used in the roughening of the nitrogen face of GaN. Instead, the polished nitrogen face is exposed for to a solution of KOH at 60° C. with an additive to produce a high density of roughening nucleation sites. In one embodiment, the additive is silicic acid hydrate at 4.6 g per 120 mL of 9% KOH. In another embodiment, the additive is silica gel. After exposure to this pre-roughening solution, the wafer may be exposed to hydrochloric acid or another acid to adjust the roughness nucleation site density. In FIG. 31A, the wafer has been exposed to 37% HCl for 5 minutes, although other chemicals, concentrations and times can be used to obtain the desired roughness scale (depth and pitch). After exposing to silicic acid hydrate to initiate the roughness nucleation points, then adjusting further with hydrochloric acid, the wafer is finally roughened in 9% KOH at 60° C. for 30 minutes to produce the surface roughness seen in FIG. 31A.

Figure 31B:
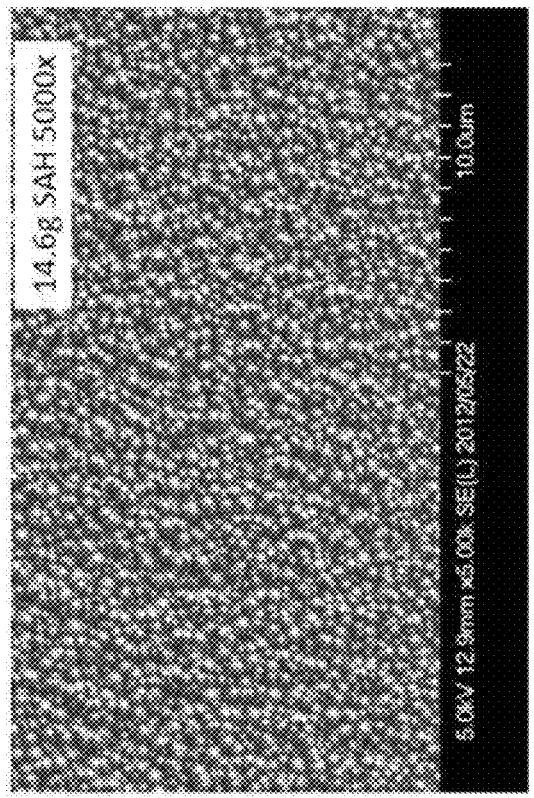
FIG. 31B exemplifies roughness when a higher concentration SAH chemical etching is used instead of illumination techniques to roughen a face of an LED die, according to some embodiments.

FIG. 31B exemplifies roughness when a higher concentration of silicic acid additive (14.6 g in 120 mL of 9% KOH) is used to create the roughening nucleation sites. In this Figure, the procedure was the same as in FIG. 31A except for the concentration of silicic acid hydrate in KOH: 5 minutes in 9% KOH with 14.6 g silicic acid hydrate at 60° C., 5 minutes in 37% HCl at 25° C., and 30 minutes in 9% KOH at 60° C. In all instances there was no illumination of the wafer during roughening. As can be seen by comparing FIG. 31A and FIG. 31B, the roughness scale can be controlled by the process conditions to optimize the light extraction.

Figure 32:
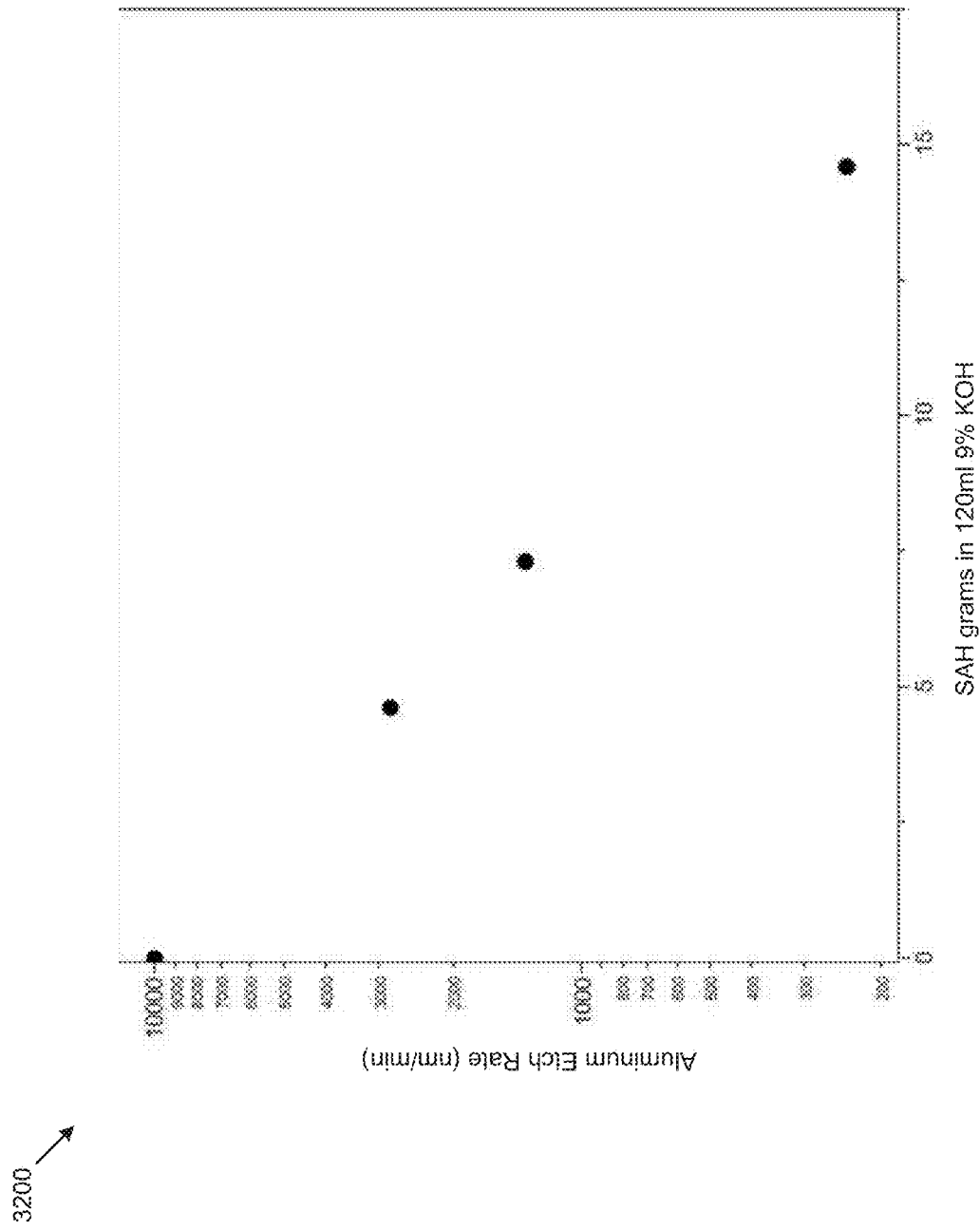
FIG. 32 shows aluminum etch rates across a range of SAH concentrations in KOH, according to some embodiments.

FIG. 32 shows aluminum etch rates across a range of silicic acid hydrate concentrations in KOH. In some embodiments of LED fabrication, it is desirable to have exposed aluminum contacts during the roughening process. However, aluminum is rapidly etched away in KOH-water solutions. The figure shows that through increasing the concentration of silicic acid hydrate the removal of aluminum can be controlled such that the roughening process is made compatible with aluminum contacts.

Figure 33:
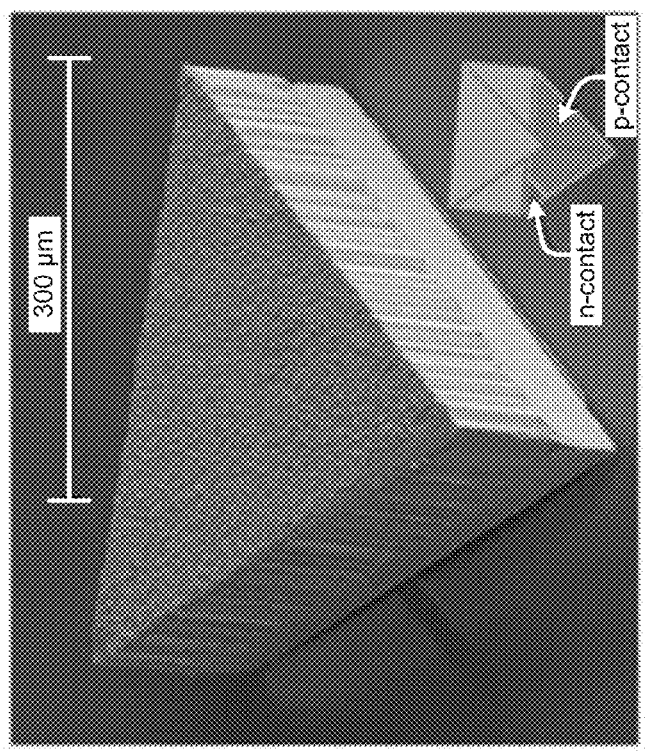
FIG. 33 is a rendering of a triangular die formed using some of the disclosed techniques, according to some embodiments.

FIG. 33 is a rendering of a triangular die formed using certain of the disclosed techniques.

Figure 34B:
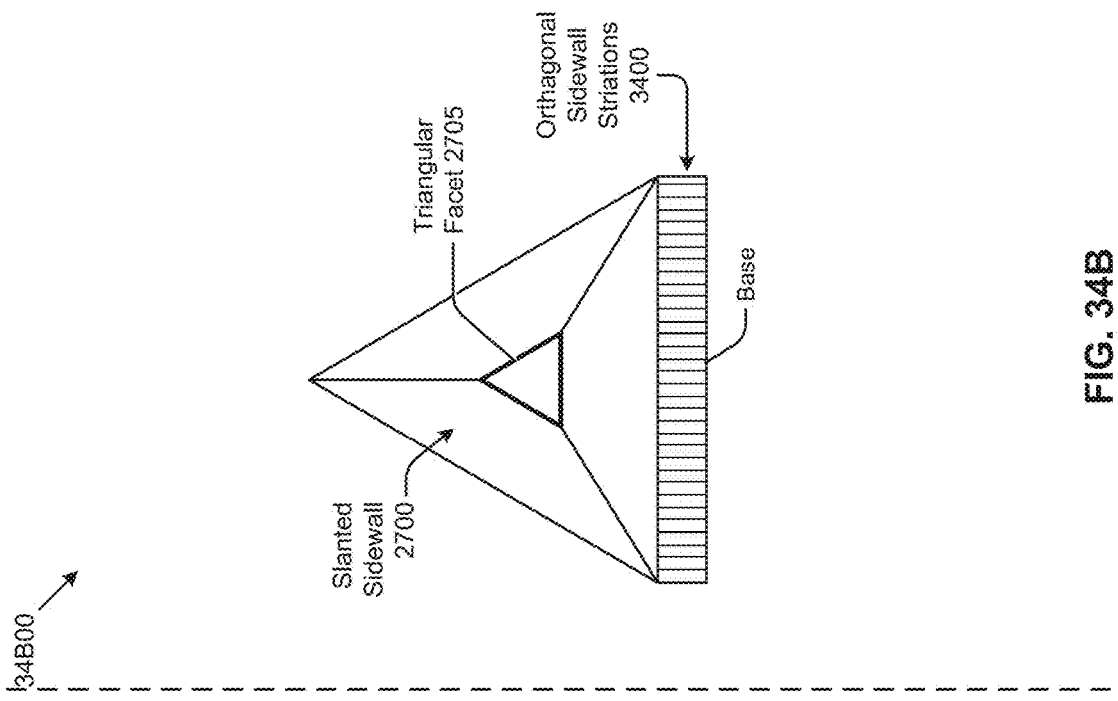
FIG. 34B presents an elevated top view of a slanted sidewall tetragonal LED chip formed by various laser ablation techniques, according to some embodiments.
Figure 34A:
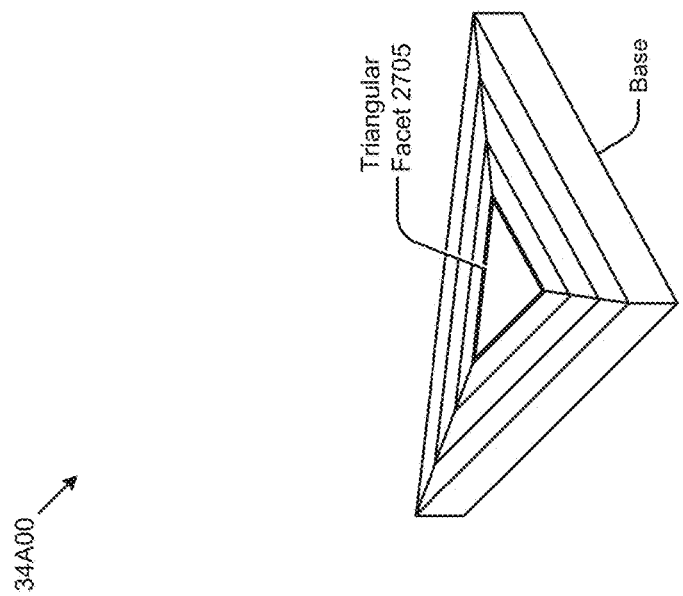
FIG. 34A presents an elevated top view of a terraced tetragonal LED chip formed by various laser ablation techniques, according to some embodiments.

FIG. 34A presents an elevated top view of a terraced tetragonal LED chip formed by various laser ablation techniques. The shown embodiment has terraces of varying widths. The terraces nearer to the triangular facet 2705 are slightly narrower than the terraces near the base.

FIG. 34B presents an elevated top view of a slanted sidewall tetragonal LED chip formed by various laser ablation techniques. The shown embodiment has three slanted sidewalls, each of which form an incline between the base and the triangular facet. The slanted sidewalls might be roughened by any of the aforementioned etching techniques.

Figure 34C:
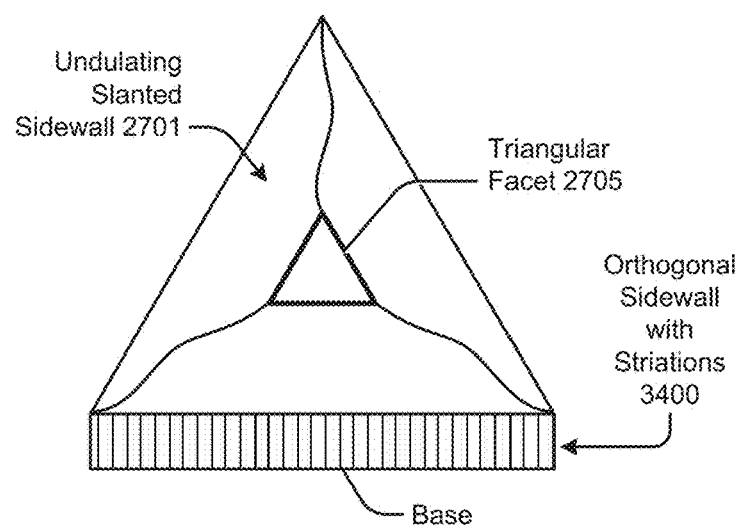
FIG. 34C presents an elevated top view of an undulating slanted sidewall tetragonal LED chip formed by various laser ablation and etching techniques, according to some embodiments.

FIG. 34C presents an elevated top view of an undulating slanted sidewall tetragonal LED chip formed by various laser ablation and etching techniques. The shown embodiment has three instances of an undulating slanted sidewall 2701, each of which forms an incline between the base and the triangular facet. The undulating slanted sidewalls might be roughened by any of the aforementioned etching techniques.

An optical device can be formed using a die having the shape as is depicted in FIG. 34C. In some cases the undulating slanted sidewalls sweep-out two undulations. In some cases the undulating slanted sidewalls sweep-out more than two undulations. Areas or portions of areas (e.g., regions) that are formed by the at least two undulations are both substantially curved (as depicted). In other embodiments, two or more regions that are formed by the at least two undulations are each substantially planar (see FIG. 27B).

Figure 34D:
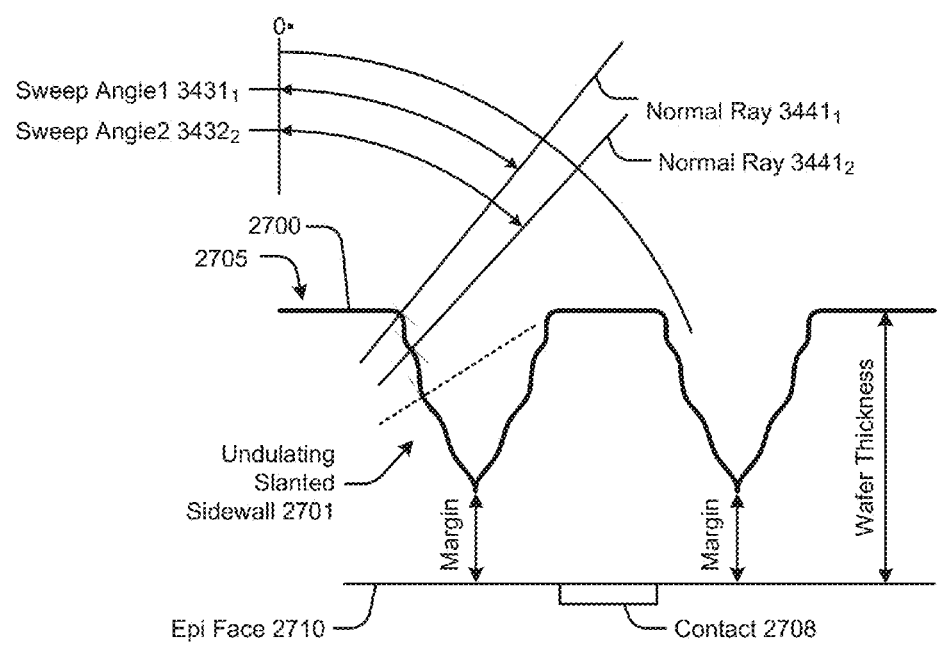
FIG. 34D presents a side view of an undulating slanted sidewall tetragonal LED chip formed by various laser ablation and etching technique, according to some embodiments.

FIG. 34D presents a side view of an undulating slanted sidewall tetragonal LED chip formed by various laser ablation and etching techniques. The shown embodiment has undulating slanted sidewalls, each of which instance of the undulating slanted sidewall 2701 form an incline, at least a portion of which is inclined between the plane of the epi face 2710 and the plane of the substrate face 2700. The undulating slanted sidewalls might be roughened by any of the aforementioned etching techniques.

In some embodiments, the variation of undulation over the incline is such that the angle swept out by a normal line segment or normal ray (e.g., normal ray $3441_1$ and normal ray $3441_2$) sweeps out at least 4.5 degrees. Variations in the angle swept out by a normal line segment or normal ray (e.g., see sweep angle1 3431 and sweep angle2 3432) affects light extraction. In some cases, application of the aforementioned laser ablation techniques and etching techniques produces a shaped die having undulating inclined sidewalls that are composed of only convex portions such that the angle swept out by a line segment that is normal to the undulations sweeps out an angle that is 90 degrees or less.

Figure 35:
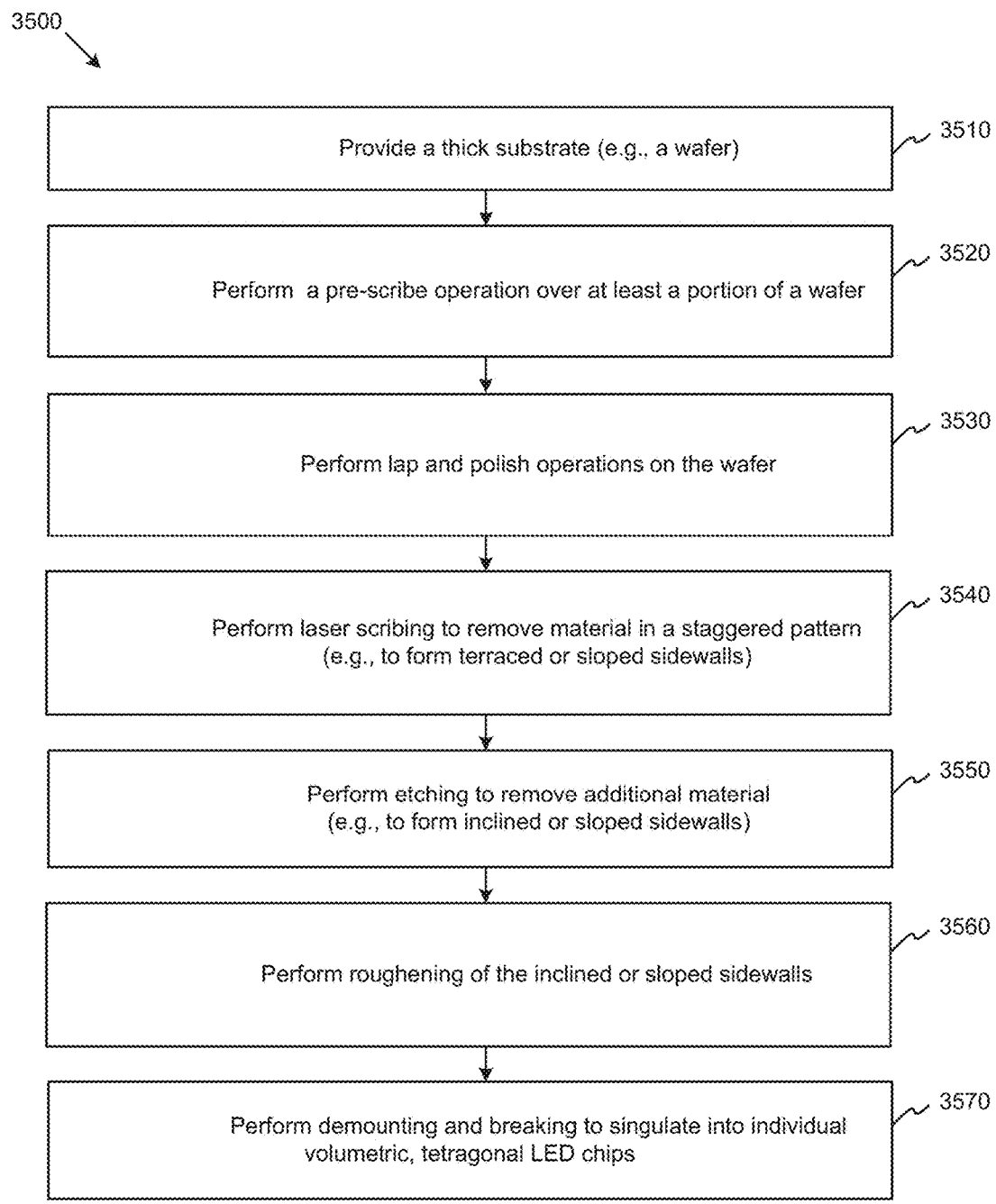
FIG. 35 depicts steps in a method for forming a volumetric LED chip using laser ablation and scribing processes, according to some embodiments.

FIG. 35 depicts steps in a method for forming a volumetric LED chip using laser ablation and scribing processes. As shown, the processing steps include:

Provide a gallium and nitrogen containing substrate (see step 3510). The substrate may have completed some or all processing of contacts, dielectrics, vias, and solder deposition. If not complete, additional steps may be performed to complete device fabrication after the roughening and before the final singulation.

Perform a pre-scribe operation over at least a portion of a wafer (see step 3520). This pre-scribe may have a depth of only a few microns, or up to a significant fraction or percentage of the wafer thickness such as 30%. One purpose is to serve as a stress concentration point for later singulation operations, such that the fracture that separates the chips passes along the pre-scribe as opposed to through layers of the device. The critical geometry of the pre-scribe is the sharpness of the tip, the depth of the pre-scribe, and the aspect ratio of the pre-scribe, i.e. the depth of the pre-scribe divided by the largest opening. The pre-scribe may be formed by a laser ablation method or by other dry etching methods such as inductively-coupled plasma (ICP) etching that are able to produce a deep, narrow trenches. The pre-scribe could be created after the roughening and demount, but it may be preferred to do it before wafer thinning when the wafer is less fragile.

Perform lap/grind and polish operations on the wafer (see step 3530). The final thickness is chosen in conjunction with the die dimensions and sidewall slope to optimize extraction while providing a conductive layer for current spreading. For example, the final thickness after polishing might be 150 microns.

Perform laser scribing to remove material in a staggered pattern (see step 3540)

Perform etching to remove additional material (see step 3550). This etching includes removal of laser slag, which may require chemicals other than typically used for GaN roughening/etching. For instance, one such chemical to remove laser slag is potassium ferricyanide. GaN etching may be accomplished in concentrated or dilute basic solutions at elevated temperatures and/or with illumination to increase the etch rate Perform roughening of the inclined or sloped sidewalls (see step 3560), including roughening of the top flat mesa portion if present. This can also be accomplished in basic solutions, with the possible addition of chemical pretreatments (silicic acid, hydrochloric acid) to control the density of the roughening.

Perform demounting and breaking to cingulate into individual volumetric, tetragonal LED chips (see step 3570). The demounting refers to removing the wafer from a mechanical support material if needed, e.g. by dissolving a wax mount or other such wafer mounting techniques. The singulation step applies a mechanical force to propagate a crack between the pre-scribe and the roughened/sloped surface. This is accomplished by, for instance, striking one side of the wafer with a breaker bar while holding fixed the other surface, or by applying a stretching force to a wafer mounted on a stretchable tape.

Descriptions of Exemplary Embodiments

According to an embodiment, the present disclosure relates to a technique where the side roughness is formed by cleaving/sawing the chip.

According to an embodiment, the present disclosure relates to a technique where the side roughness is formed by chemical or PEC etching.

According to an embodiment, the present disclosure relates to a technique where the side roughness is formed by patterning and dry etching of the chip.

According to an embodiment, the present disclosure relates to a technique where the side roughness if formed by separation of the devices by laser ablation of the material in-between, followed by etching of the laser process by-products inducing a 2-D roughness on the crystalline face of the device.

According to an embodiment, the present disclosure relates to a technique where the side roughness is formed by depositing a film (such as a dielectric) on the side of the LED and texturing it.

According to an embodiment, the present disclosure relates to a technique where slanted sidewalls are formed by laser scribing with multiple beams.

According to an embodiment, the present disclosure relates to a technique where a Group III-nitride layer is grown on a foreign substrate (and possibly separated from the foreign substrate) such that the vertical-to-horizontal aspect ratio of the Group III-nitride layer is at least 5%, and LEDs with top and sidewall roughness are formed.

According to an embodiment, the present disclosure relates to a technique where a layer of a Group III-nitride substrate is separated from the rest of the substrate such that the vertical-to-horizontal aspect ratio of the resulting Group III-nitride layer is at least 5%, and LEDs with top and sidewall roughness are formed.

In one embodiment, a plurality of light emitting diode devices is provided overlying a bulk-GaN containing substrate. Through suitable fabrication steps, a plurality of p-type metallic ohmic contacts is provided overlying the p-type GaN layer of the light emitting diode device structure, as part of the embodiment. Additionally, a plurality of n-type ohmic contacts is provided overlying the n-type GaN layer of the light emitting diode device structure, as part of the embodiment.

In an embodiment, the plurality of light emitting diode devices is singulated into individual chips using wafer sawing or dicing, where the wafer sawing or dicing induces a surface texture or roughness on the sidewalls of the singulated light emitting diode chips, where the surface texture or roughness has a characteristic pattern, pitch or shape which enhances the extraction of light from the light emitting diode chip. In one embodiment, a suitable wet chemical etching step may be applied after the wafer sawing or dicing step, so as to form a second texture or roughness characterizing the plurality of surfaces exposed to the wet etching step, where the second surface texture or roughness has a characteristic pattern, pitch or shape which enhances the extraction of light from the light emitting diode chip.

In another embodiment, the plurality of light emitting diode devices is singulated into individual chips using laser scribing followed by breaking, where the laser scribing induces a surface texture or roughness on the sidewalls of the singulated light emitting diode chips, where the surface texture or roughness has a characteristic pattern, pitch or shape which enhances the extraction of light from the light emitting diode chip. In an particular embodiment, a suitable wet chemical etching step may be applied between the laser scribing and breaking steps, in order to remove the slag formed as a result of the laser scribing, and this wet etching step may result in a second texture or roughness characterizing the plurality of surfaces exposed to the wet etching step, where the second surface texture or roughness has a characteristic pattern, pitch or shape which enhances the extraction of light from the light emitting diode chip.

In another embodiment, the plurality of light emitting diode devices are singulated into individual chips by fully ablating the substrate material between devices utilizing a laser. The laser ablation process induces a rough surface of slag and crystalline material on the side faces of the chips. The slag material can be etch away to prevent light absorption and retain only the roughness from the crystalline material. Alternatively, the slag itself can be used as a mask in conjunction with etching to imprint the roughness on the crystalline material followed by the removal of the slag material.

In another embodiment, the plurality of light emitting diode devices is singulated into individual chips using diamond scribing and breaking, where the diamond scribing and breaking step induces a surface texture or roughness on the sidewalls of the singulated light emitting diode chips, where the surface texture or roughness has a characteristic pattern, pitch or shape which enhances the extraction of light from the light emitting diode chip. In an embodiment, the diamond scribing and breaking may be performed along a direction or a plurality of directions which are substantially misaligned with respect to a crystalline direction or a plurality of crystalline directions of the GaN-containing substrate.

In another embodiment, the diamond scribing and breaking may be performed along a direction or plurality of directions which are substantially aligned with respect to a crystalline direction or plurality of crystalline directions of the GaN-containing substrate.

In yet another embodiment, the plurality of light emitting diode devices is singulated into individual chips using diamond scribing and breaking. In this embodiment, a suitable wet chemical etching step may be applied between the diamond scribing and breaking steps, so as to form a second texture or roughness characterizing the plurality of surfaces exposed to the wet etching step, where the second surface texture or roughness has a characteristic pattern, pitch or shape which enhances the extraction of light from the light emitting diode chip.

In an embodiment, the diamond scribing and breaking may be performed along a direction or a plurality of directions which are substantially misaligned with respect to a crystalline direction or a plurality of crystalline directions of the GaN-containing substrate. Alternatively, the diamond scribing and breaking may be performed along a direction or plurality of directions which are substantially aligned with respect to a crystalline direction or plurality of crystalline directions of the GaN-containing substrate. That is, the scribing is performed along at least one direction or a plurality of directions that are substantially misaligned with respect to a crystalline direction or a plurality of crystalline directions plane of the gallium and nitrogen containing substrate. In an embodiment, the direction is substantially misaligned is within ±5 degrees or ±10 degrees or ±20 degrees of the plane of the gallium and nitrogen containing substrate. As used herein, the term misaligned is provided intentionally and is generally an offset or the like. Depending upon the embodiment, the plane of the gallium and nitrogen containing substrate is one of a plurality of planes of the substrate material selected from a group consisting of at least c-plane, m-plane, or a-plane or others and their combinations, and semipolar planes. Again, there can be other variations, modifications, and alternatives.

In an embodiment, the characteristic texture or roughness may be substantially dissimilar across the plurality of surfaces formed as a result of the light emitting diode device singulation process. In yet another embodiment, the characteristic texture or roughness may be substantially similar across the plurality of surfaces formed as a result of the light emitting diode device singulation process.

In an embodiment, no specific means or methods are applied to apply a surface texture or roughness to the surface or plurality of surfaces of the light emitting diode device chip which are overlaid by the p-type metallic contact or n-type metallic contact or both. In another embodiment, means or methods are applied to apply a surface texture or roughness to the surface or plurality of surfaces of the light emitting diode device chip which are overlaid by the p-type metallic contact or n-type metallic contact or both.

The foregoing description of the exemplary embodiments has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

In the foregoing specification, the disclosure has been described with reference to specific embodiments thereof. It will, however, be evident that various modifications and changes may be made thereto without departing from the broader spirit and scope of the disclosure. For example, the above-described process flows are described with reference to a particular ordering of process actions. However, the ordering of many of the described process actions may be changed without affecting the scope or operation of the disclosure. The specification and drawings are, accordingly, to be regarded in an illustrative sense rather than in a restrictive sense.

What is claimed is:

1. A method of fabricating LEDs from a wafer comprising a substrate having a surface, said method comprising:
    applying a laser beam across said surface to define at least one laser-scribed recess having a laser-machined surface; and
    singulating said wafer along said laser-scribed recess to form singulated LEDs, said singulated LEDs having a top surface, a bottom surface, and a plurality of sidewalls, at least one of said sidewalls comprising at least a first portion and a second portion, said first portion comprising at least a portion of said laser-machined surface, wherein said laser-machined surface is characterized by being non-perpendicular to said top surface.

2. The method of claim 1, wherein said second portion is essentially orthogonal to said top surface, and said first and second portions are non-planar.

3. The method of claim 1, wherein said first and second textures are different and said first texture comprises terraces.

4. The method of claim 1, wherein said first and second textures are different and said second texture comprises vertical striations.

5. The method of claim 1, wherein said first and second textures are different and said second portion is orthogonal to said top surface.

6. The method of claim 1, wherein first portion is defined along a non-crystallographic plane of said substrate, and second portion is defined along a crystallographic plane of said substrate.

7. The method of claim 1, wherein each of said sidewalls comprises said first portion and said second portion.

8. The method of claim 1, wherein said recess is a continuous groove.

9. The method of claim 1, wherein said recess comprises a plurality of non-continuous recesses.

10. The method of claim 1, wherein applying said laser beam comprises making a plurality of passes on said wafer to define said at least one laser-scribed recess.

11. The method of claim 1, wherein said laser beam is non-uniform in power across its beam to shape said laser-machined surface.

12. The method of claim 1, wherein said laser-machine surface is flat, curved, or comprises multiple facets.

13. The method of claim 12, wherein said laser-machined surface has multiple facets.

14. The method of claim 1, wherein the bottom surface of the singulated LEDs has a triangular shape.

15. The method of claim 1, further comprising chemical etching after said applying.

16. The method of claim 15, wherein said chemical etching comprises etching using at least one of KOH solutions, HIE solutions, or EDTA solutions.

17. The method of claim 1, further comprising roughening to impart surface roughness to said top surface of said singulated LEDs.

18. The method of claim 1, wherein the substrate is a bulk GaN substrate.

19. The method of claim 1, wherein both said first texture is different from said second texture, and said wherein first and second textures have rough features with an average vertical size between 100 nm and 10 μm.

* * * * *